United States Patent
Wu

(10) Patent No.: US 6,531,734 B1
(45) Date of Patent: Mar. 11, 2003

(54) SELF-ALIGNED SPLIT-GATE FLASH MEMORY CELL HAVING AN INTEGRATED SOURCE-SIDE ERASE STRUCTURE AND ITS CONTACTLESS FLASH MEMORY ARRAYS

(75) Inventor: Ching-Yuan Wu, Hsinchu (TW)

(73) Assignee: Silicon Based Technology Corp. (TW)

( * ) Notice: Subject to any disclaimer, the term of this patent is extended or adjusted under 35 U.S.C. 154(b) by 0 days.

(21) Appl. No.: 10/153,905

(22) Filed: May 24, 2002

(51) Int. Cl.[7] .............................................. H01L 29/788
(52) U.S. Cl. ........................ 257/315; 257/316; 257/317; 257/319; 257/320; 257/321
(58) Field of Search ................................. 257/315, 316, 257/317, 319, 320, 321; 438/263, 264, 594

(56) References Cited

U.S. PATENT DOCUMENTS

| | | |
|---|---|---|
| 5,242,848 A | 9/1993 | Yeh |
| 5,801,414 A | 9/1998 | Shinmori |
| 5,989,960 A | 11/1999 | Fukase |
| 6,103,573 A | 8/2000 | Harari et al. |
| 6,208,557 B1 | 3/2001 | Bergemount et al. |
| 6,221,716 B1 | 4/2001 | Lee et al. |
| 6,462,375 B1 * | 10/2002 | Wu .............................. 257/316 |

* cited by examiner

*Primary Examiner*—Tom Thomas
*Assistant Examiner*—Thien F Tran

(57) ABSTRACT

A self-aligned split-gate flash memory cell of the present invention comprises an integrated floating-gate layer being at least formed on a first gate-dielectric layer having a first intergate-dielectric layer formed on its top and a second intergate-dielectric layer formed on its inner sidewall; a planarized control/select-gate layer being at least formed on a second gate-dielectric layer and the first second intergate-dielectric layers; a common-source and a common-drain diffusion regions; and an integrated source-side erase structure being at least formed on a portion of the common-source diffusion region and on a tunneling-dielectric layer formed over an outer sidewall of the integrated floating-gate layer. The self-aligned split-gate flash memory cells are configured into two contactless array architectures: a contactless NOR-type array and a contactless parallel common-source/drain conductive bit-lines array.

26 Claims, 16 Drawing Sheets

US 6,531,734 B1

SELF-ALIGNED SPLIT-GATE FLASH MEMORY CELL HAVING AN INTEGRATED SOURCE-SIDE ERASE STRUCTURE AND ITS CONTACTLESS FLASH MEMORY ARRAYS

BACKGROUND OF THE INVENTION

1. Field of the Invention

The present invention relates generally to a split-gate flash memory cell and its memory array and, more particularly, to a self-aligned split-gate flash memory cell and its contactless flash memory array for high-speed erasing operation in high-density mass storage applications.

2. Description of Related Art

The flash memory cells of the prior arts, based on the cell structure, can be categorized into two groups: a stack-gate structure and a split-gate structure. The stack-gate flash memory cell is in general programmed by channel hot-electron injection (CHEI), the programming power is large and the programming efficiency is low. In general, the stack-gate length is defined by a minimum-feature-size (F) of technology used, the cell size of a stack-gate flash memory cell is relatively smaller and is, therefore, favorable for high-density mass storage applications. However, the stack-gate length is difficult to be scaled due to the punch-through effect if the channel hot-electron injection is used as a programming method. Moreover, the applied control-gate voltage for programming is difficult to be scaled due to the coupling ratio; the erasing speed based on Fowler-Nordheim tunneling between the floating-gate and the source diffusion region becomes poor due to the scaled tunneling area; and the over-erase problem needs a complicate control circuit for verification.

The split-gate flash memory cell is in general programmed by mid-channel hot-electron injection, the programming power is relatively smaller and the programming efficiency is high. However, the cell size of a spit-gate flash memory cell is much larger than that of the stack-gate flash memory cell and is, therefore, usually used in low-density storage applications. A typical split-gate flash memory device is shown in FIG. 1A, in which a floating-gate layer 111 is formed by local-oxidation of silicon (LOCOS) technique and the floating-gate length is defined in general to be larger than a minimum-feature-size of technology used due to the bird's beak formation; the control-gate 115 is formed over a LOCOS-oxide layer 112 and a thicker select-gate oxide layer 114; a poly-oxide layer 113 is formed over a sidewall of the floating-gate layer 111; a source diffusion region 116 and a drain diffusion region 117 are formed in a semiconductor substrate 100 in a self-aligned manner; and a thin gate-oxide layer 110 is formed under the floating-gate layer 111. From FIG. 1A, it is clearly visualized that the cell size is larger due to the non-self-aligned control-gate structure; the gate length can't be easily scaled down due to the misalignment of the control-gate 115 with respect to the floating-gate 111; the field-emission tip of the floating-gate layer 111 is difficult to be controlled due to the weak masking ability of the bird's beak oxide; and the coupling ratio is low and higher applied control-gate voltage is required for erasing electrons from the floating-gate tip to the control gate 115.

FIG. 1B shows another split-gate structure, in which the floating-gate layer 121 is defined by a minimum-feature-size of technology used; a thin tunneling-oxide layer 120 is formed under the floating-gate layer 121; a select- gate dielectric layer 122 is formed over the select-gate region and the exposed floating-gate layer 121; a control-gate layer 123 is formed over the select-gate dielectric layer 122; a source diffusion region 124 and a double-diffusion drain region 125,126 are formed in a semiconductor substrate 100. From FIG. 1B, it is clearly visualized that similar drawbacks as listed for FIG. 1A are appeared although the coupling ratio is slightly improved by the select-gate dielectric layer 122 used. However, the erasing site is located at the thin tunneling-oxide layer 120 between the floating-gate layer 121 and the double-diffused drain region 125,126, the erasing voltage is much higher than that of a stack-gate structure due to the smaller coupling ratio.

It is therefore an objective of the present invention to offer a self-aligned split-gate flash memory cell having a cell size being smaller than $4F^2$.

It is another objective of the present invention to offer a higher coupling ratio for a self-aligned split-gate flash memory cell.

It is a further objective of the present invention to provide a source-side erase structure for a self-aligned split-gate flash memory cell and its contactless flash memory arrays to increase the erasing speed.

It is yet another objective of the present invention to offer two contactless array architectures for forming self-aligned split-gate flash memory arrays.

Other objectives and advantages of the present invention will be apparent from the following description.

SUMMARY OF THE INVENTION

A self-aligned split-gate flash memory cell of the present invention is formed on a semiconductor substrate of a first conductivity type having an active region isolated by two parallel shallow-trench isolation (STI) regions. A cell region can be divided into three regions: a common-source region, a gate region, and a common-drain region, wherein the gate region is located between the common-source region and the common-drain region. The common-source region comprises a common-source diffusion region; a first sidewall dielectric spacer acting as a tunneling-dielectric layer being formed over a sidewall of the gate region and on a portion of a first flat bed being formed by a shallow heavily-doped source diffusion region of a second conductivity type formed within a common-source diffusion region in the active region and two etched first raised field-oxide layers in the two parallel STI regions; a common-source conductive bus line acting as an erase anode being formed over the first flat bed outside of the first sidewall dielectric spacer; a first auxiliary sidewall dielectric spacer being formed over the first sidewall dielectric spacer and on a portion of the common-source conductive bus line; a auxiliary common-source conductive bus line being formed over a common-source conductive bus line outside of the first auxiliary sidewall dielectric spacer; and a first planarized thick-oxide layer being formed over the auxiliary common-source conductive bus line. The common-drain region comprises a second sidewall dielectric spacer being formed over another sidewall of the gate region and on a portion of a second flat bed being formed by a shallow heavily-doped drain diffusion of a second conductivity type formed within a common-drain diffusion region in the active region and two etched second raised field-oxide layers in the two parallel STI regions; a common-drain conductive bus line or a common-drain conductive island being formed over the second flat bed outside of the second sidewall dielectric spacer; and a second planarized thick-oxide layer is formed over the common-drain conductive bus line. The gate region comprises an integrated floating-gate layer having a major floating-gate layer formed on a first gate-dielectric layer in a portion of the active region near the common-source diffusion region and two extended floating-gate layers separately formed on a portion of the two first raised field-oxide layers in the two parallel STI regions with a first intergate-dielectric layer being formed on its top and a second intergate-dielectric layer being formed over its inner sidewall; a second gate-dielectric layer being formed in another portion of the active region near the common-drain diffusion region; and an elongated planarized control/select-gate conductive layer or a planarized control/select-gate conductive island being at least formed over the first/second intergate-dielectric layers and the second gate-dielectric layer.

The self-aligned split-gate flash memory cell of the present invention as described is used to implement two contactless array architectures: a contactless NOR-type flash memory array and a contactless parallel common-source/drain conductive bit-lines flash memory array. The contactless NOR-type flash memory array comprises a plurality of common-source conductive bus lines being formed alternately and transversely to a plurality of parallel STI regions, wherein each of the plurality of common-source conductive bus lines is formed between a pair of first sidewall dielectric spacers and on a first flat bed being alternately formed by a shallow heavily-doped source diffusion region of a second conductivity type formed within a common-source diffusion region and an etched first raised field-oxide layer; a plurality of common-drain conductive islands being at least formed over a plurality of active regions in each of the common-drain regions between the plurality of common-source conductive bus lines, wherein each of the plurality of common-drain conductive islands is formed between a pair of second sidewall dielectric spacers and on a shallow heavily-doped drain diffusion region of a second conductivity type formed within a common drain diffusion region in the active region and a portion of etched second raised field-oxide layers in the nearby parallel STI regions; a plurality of self-aligned split-gate flash memory cells being formed between each of the plurality of common-source conductive bus lines and its nearby common-drain conductive islands with an elongated planarized control/select-gate conductive layer being acted as a word line; and a plurality of bit lines integrated with the plurality of common-drain conductive islands being simultaneously patterned and etched by a plurality of hard masking layers being transversely to the plurality of common-source conductive bus lines.

The contactless parallel common-source/drain conductive bit-lines flash memory array of the present invention comprises a plurality of common-source conductive bus lines and a plurality of common-drain conductive bus lines being formed alternately and transversely to a plurality of parallel STI regions, wherein each of the plurality of common-source/drain conductive bus lines is formed between a pair of first/second sidewall dielectric spacers and on the first/second flat bed being alternately formed by a shallow heavily-doped source/drain diffusion region of a second conductivity type formed within a common-source/drain diffusion region and an etched first/second raised field-oxide layer; a plurality of self-aligned split-gate flash memory flash memory cells being formed between each of the plurality of common-source conductive bus lines and its nearby common-drain conductive bus lines; and a plurality of word lines integrated with a plurality of planarized control/select-gate conductive islands being simultaneously patterned and etched by a plurality of hard masking layers being transversely to the plurality of common-source/drain conductive bus lines.

BRIEF DESCRIPTION OF THE DRAWINGS

FIGS. 1A, 1B show the schematic diagrams of the prior art, in which FIG. 1A shows a cross-sectional view of a split-gate flash memory cell with a LOCOS floating-gate structure for erasing; FIG. 1B shows a cross-sectional view of a split-gate flash memory cell with a conventional source-side erase structure.

FIG. 2A(b) shows a cross-sectional view of a pair of self-aligned flash memory cells in a contactless parallel common-source/drain conductive bit-lines self-aligned split-gate flash memory array; FIG. 2B(b) shows a top plan view of a contactless parallel common-source/drain conductive bit-lines self-aligned split-gate flash memory array; FIG. 2C(b) shows a schematic circuit diagram of a contactless parallel common-source/drain conductive bit-lines self-aligned split-gate flash memory array.

DETAILED DESCRIPTION OF THE PREFERRED EMBODIMENTS

Figure 1A:
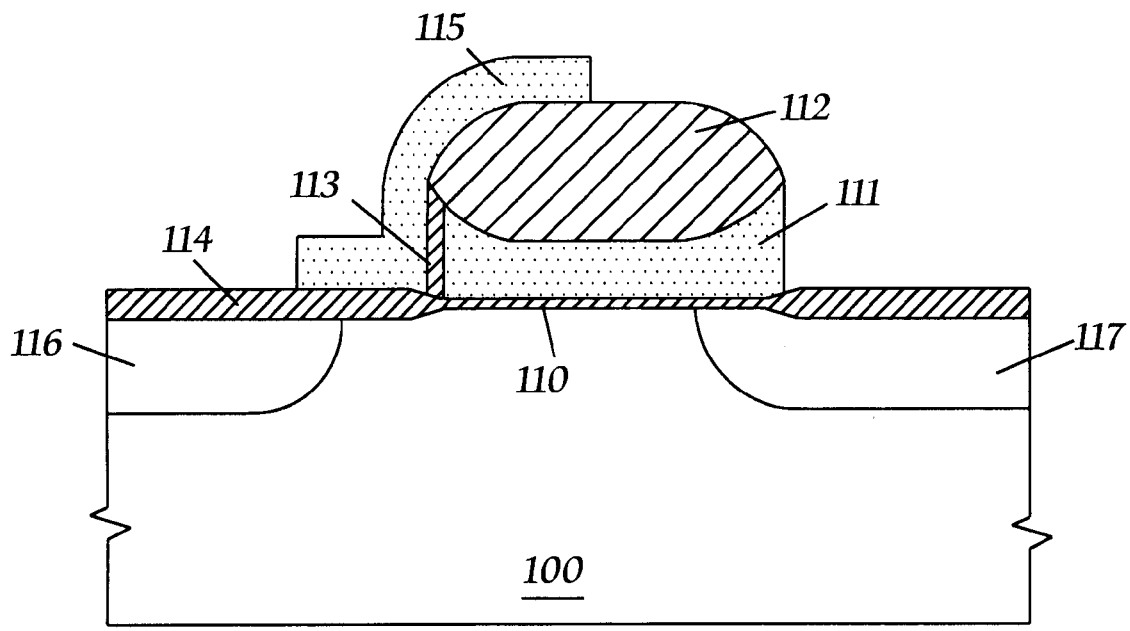
Figure 1B:
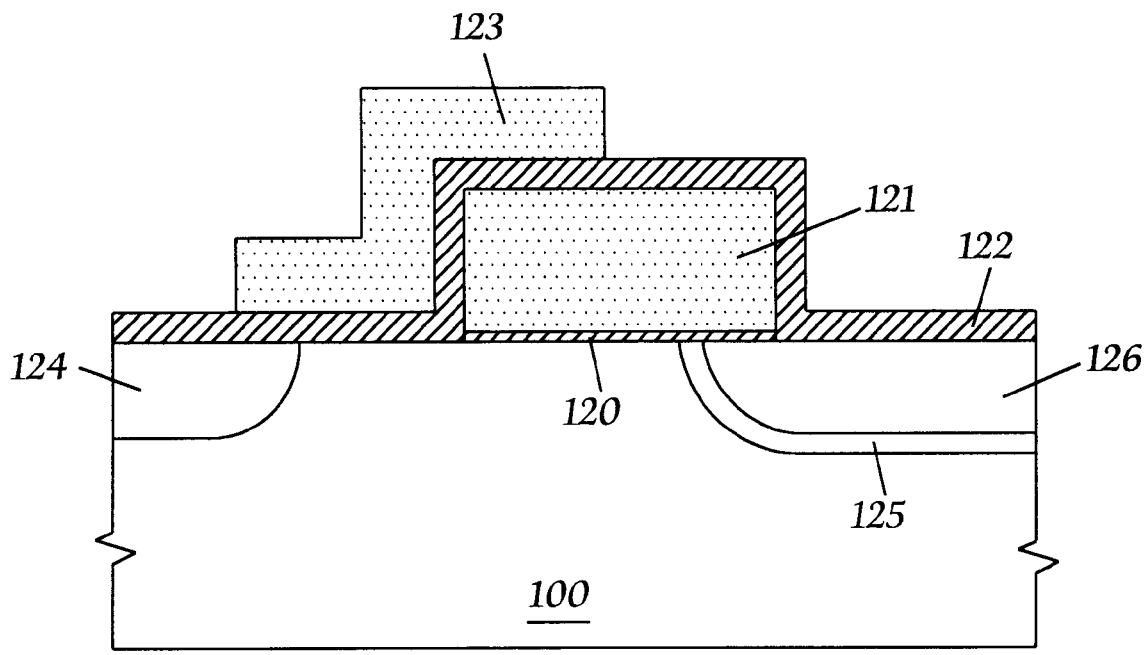
Figure 2A:
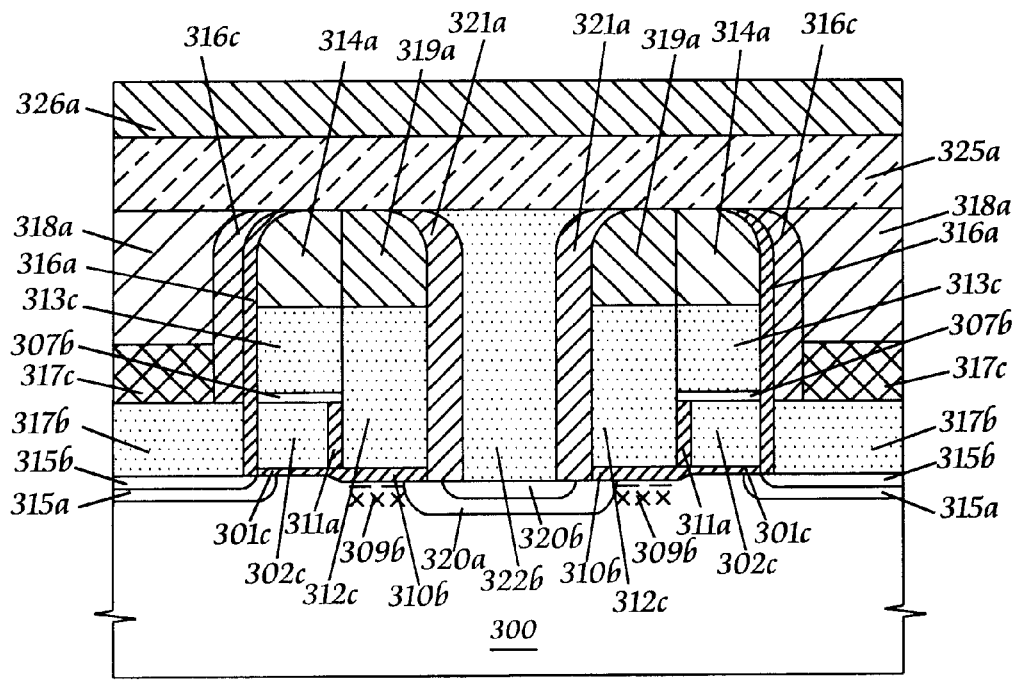
FIG. 2A(a) through FIG. 2C(b) show the schematic diagrams of the present invention, in which FIG. 2A(a) shows a cross-sectional view of a pair of self-aligned split-gate flash memory cells in a contactless NOR-type flash memory array.
Figure 2A:
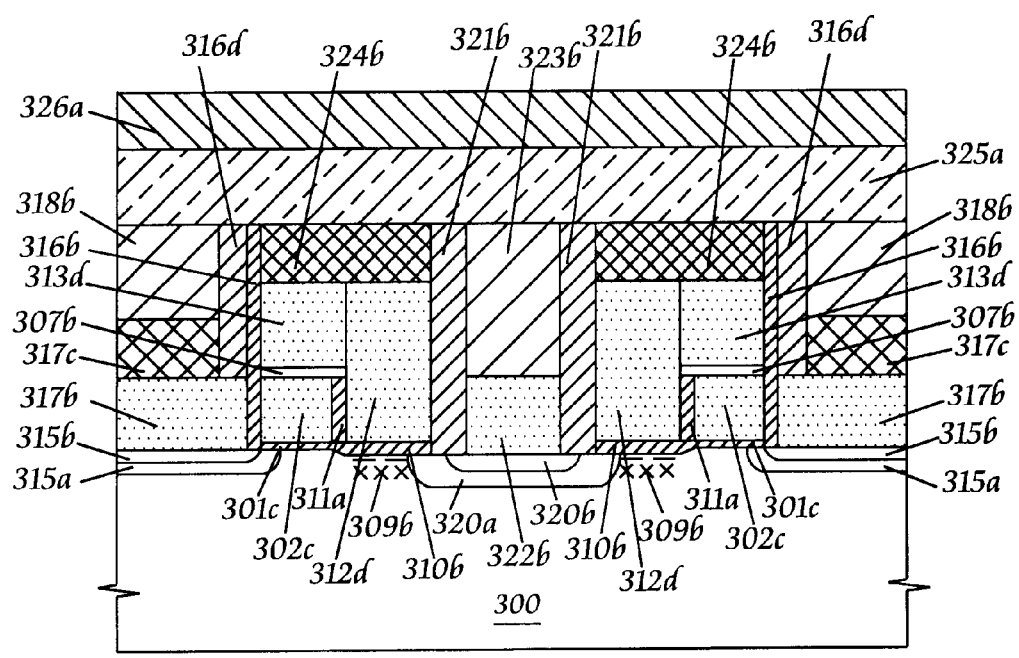
Figure 2B:
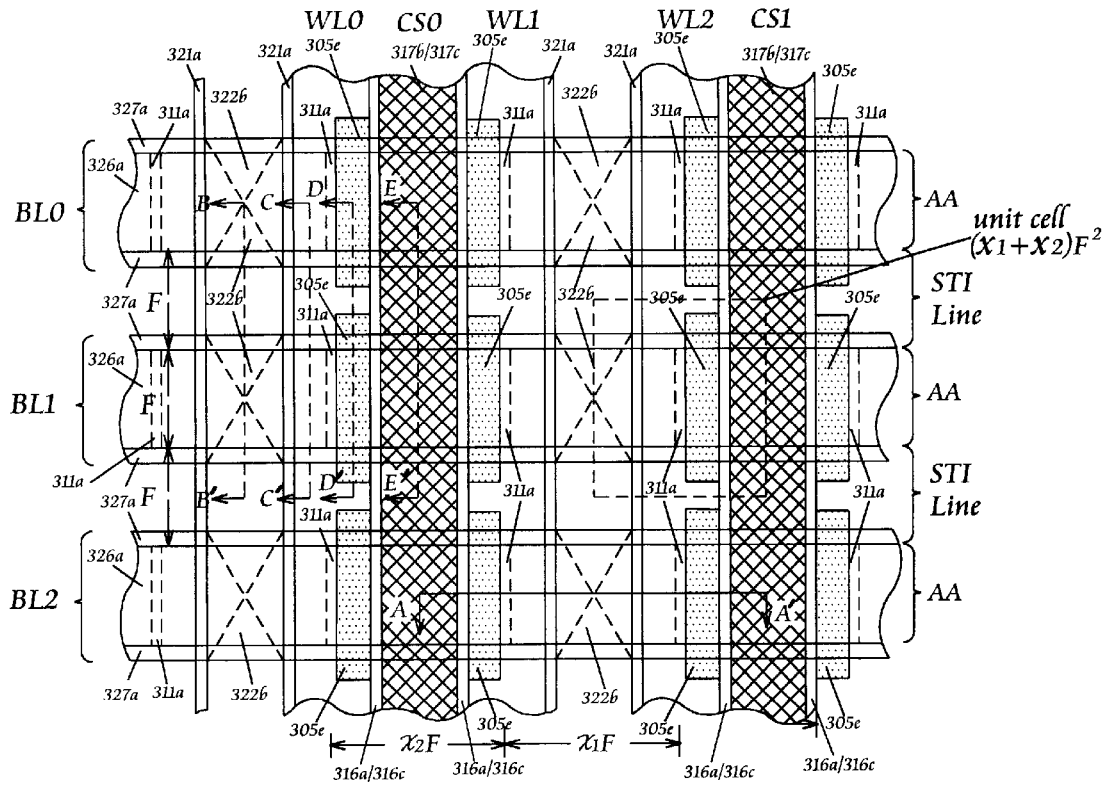
FIG. 2B(a) shows a top plan view of a contactless NOR-type self-aligned split-gate flash memory array.
Figure 2B:
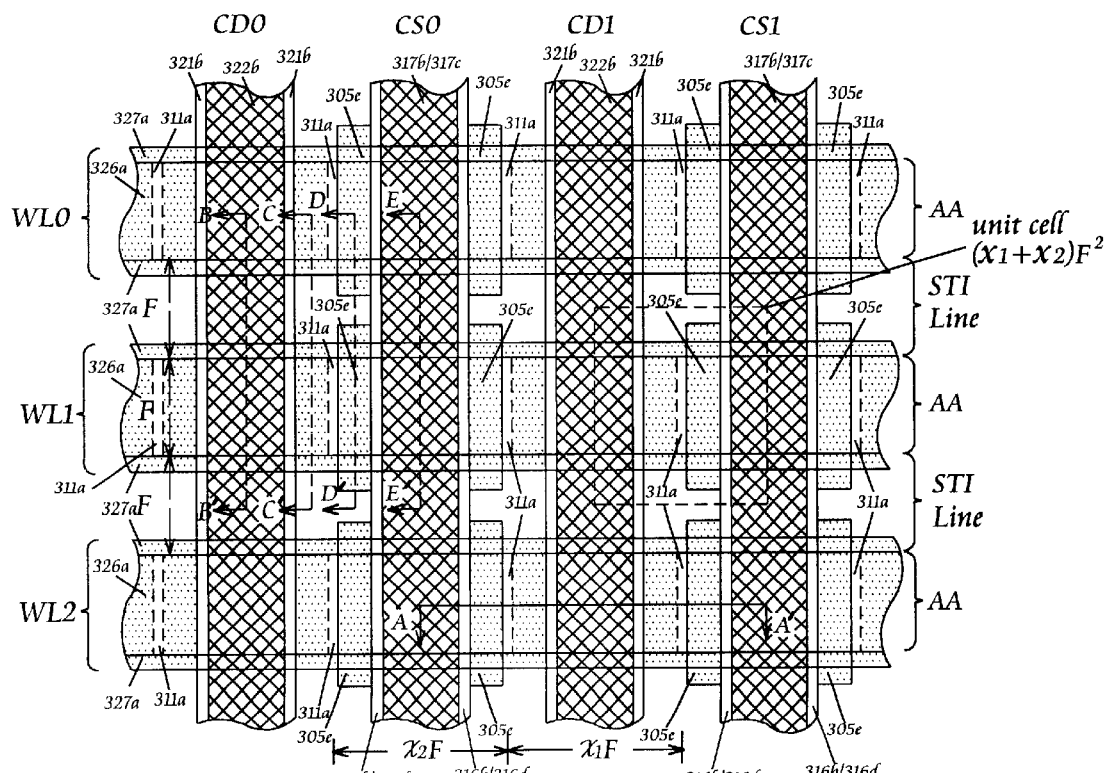

Referring now to FIG. 2A(a) and FIG. 2A(b), there are shown the cross-sectional views of a pair of self-aligned split-gate flash memory cells of the present invention being configured into two contactless array architectures shown in FIG. 2B(a) and FIG. 2B(b), respectively, in which FIG. 2A(a) shows a cross-sectional view along the A–A' line for a contactless NOR-type flash memory array shown in FIG. 2B(a) and FIG. 2A(b) shows a cross-sectional view along the A–A' line for a contactless parallel common-source/drain conductive bit-lines flash memory array shown in FIG. 2B(b).

From FIG. 2A(a), a common-source region comprises a pair of first sidewall dielectric spacers 316a being formed over each sidewall of the nearby gate regions and on a portion of a first flat bed being formed alternately by an etched first raised field-oxide layer 304c and a shallow heavily-doped source diffusion region 315b of a second conductivity type formed within a common-source diffusion region 315a; a common-source conductive bus line 317b being formed over the first flat bed between the pair of first sidewall dielectric spacers 316a; a pair of first auxiliary sidewall dielectric spacers 316c being formed over each sidewall of the pair of first sidewall dielectric spacers 316a and on a portion of the common-source conductive bus line 317b; a auxiliary common-source conductive bus line 317c being formed over the common-source conductive bus line 317b between the pair of first auxiliary sidewall dielectric spacers 316c; and a first planarized thick-oxide layer 318a being formed over the auxiliary common-source conductive bus line 317c. A gate region comprises an elongated planarized control/select-gate conductive layer 312c, 313c having a portion formed at least on a second gate-dielectric layer 310b, the nearby second raised field-oxide layers 304d, and a second intergate-dielectric layer 311a in a select-gate region and another portion formed at least over the first intergate-dielectric layer 307b in the floating-gate region, wherein the first intergate-dielectric layer 307b is at least formed over an integrated floating-gate layer 305e and the second intergate-dielectric layer 311a is formed over an inner sidewall of the integrated floating-gate layer 305e; the integrated floating-gate layer 305e having a major floating-gate layer 302c formed over a first gate-dielectric layer 301c and two extended floating-gate layers 305c formed over a portion of the nearby first raised field-oxide layers 304b; and an implanted region 309b of a first conductivity type having a shallow implant region as indicated by the dash line for threshold-voltage adjustment and a deep implant region as indicated by the cross symbols for forming a punch-through stop being formed under the second gate-dielectric layer 310b. A common-drain region comprises a pair of second sidewall dielectric spacers 321a being formed over another sidewall of the nearby gate regions and on a portion of a second flat bed being alternately formed by an etched second raised field-oxide layer 304e and a shallow heavily-doped drain diffusion region 320b of a second conductivity type formed within a common-drain diffusion region 320a; and a planarized common-drain conductive island 322b being at least formed over the shallow heavily-doped drain diffusion region 320b and on a portion of the nearby etched second raised field-oxide layers 304e of a second flat bed outside of the pair of second sidewall dielectric spacers 321a. As shown in FIG. 2A(a), a third sidewall dielectric spacer 314a is formed over a portion of the elongated planarized control/select-gate conductive layer 312c, 313c; a fourth sidewall dielectric spacer 319a is formed over another portion of the elongated planarized control/select-gate conductive layer 312c, 313c; and a first interconnect-metal layer 325a integrated with the planarized common-drain conductive islands 322b are simultaneously patterned and etched by a hard masking layer including a third masking dielectric layer 326a and its two fifth sidewall dielectric spacers 327a to form a bit line 325a transversely to the common-source conductive bus line 317b.

From FIG. 2A(b), a common-source region comprises a pair of first sidewall dielectric spacers 316b being formed over each sidewall of the nearby gate regions and on a potion of a first flat bed being formed alternately by an etched first raised field-oxide layer 304c and a shallow heavily-doped source diffusion region 315b of a second conductivity type formed within a common-source diffusion region 315a; a common-source concuive bus line 317b being formed over the first flat bed between the pair of first sidewall dielectric spacers 316b; a pair of first auxiliary sidewall dielectric spacers 316d being formed over each sidewall of the pair of first sidewall dielectric spacers 316b and on a portion of the common-source conductive bus line 317b; a auxiliary common-source conductive bus line 317c being formed over the common-source conductive bus line 317b between the pair of first auxiliary sidewall dielectric spacers 316d; and a first planarized thick-oxide layer 318b being formed over the auxiliary common-source conductive bus line 317c. A gate region comprises a planarized control/select-gate conductive island 324b, 312d, 313d having a portion formed at least on a second gate-dielectric layer 310b, the nearby second raised field-oxide layers 304d, and a second intergate-dielectric layer 311a in a select-gate region and another portion formed at least over the first intergate-dielectric layer 307b, wherein the first intergate-dielectric layer 307b is at least formed over an integrated floating-gate layer 305e and a second intergate-dielectric layer 311a is formed over an inner sidewall of the integrated floating-gate layer 305e; the integrated floating-gate layer 305e having a major floating-gate layer 302c formed over a first gate-dielectric layer 301c and two extended floating-gate layers 305c formed over a portion of the nearby first raised field-oxide layers 304b; and an implanted region 309b of a first conductivity type having a shallow implant region as indicated by the dash line for threshold-voltage adjustment and a deep implant region as indicated by the cross symbols for forming a punch-through stop being formed under the second gate-dielectric layer 310b. A common-drain region comprises a pair of second sidewall dielectric spacers 321b being formed over another sidewall of the nearby gate regions and on a portion of a second flat bed alternately formed by an etched second raised field-oxide layer 304e and a shallow heavily-doped drain diffusion region 320b of a second conductivity type formed within a common-drain diffusion region 320a; a common-drain conductive bus line 322b being formed over the second flat bed outside of the pair of second sidewall dielectric spacers 321b; and a second planarized thick-oxide layer 323b being formed over the common-drain conductive bus line 322b. As shown in FIG. 2A(b), a first interconnect-metal layer 325a integrated with the planarized control/select-gate conductive islands 324b, 313d, 312d are simultaneously patterned and etched by a hard masking layer including a third masking dielectric layer 326a and its two fifth sidewall dielectric spacers 327a to form a word line 325a transversely to the common-source/drain conductive bus lines 317b, 322b.

Figure 2C:
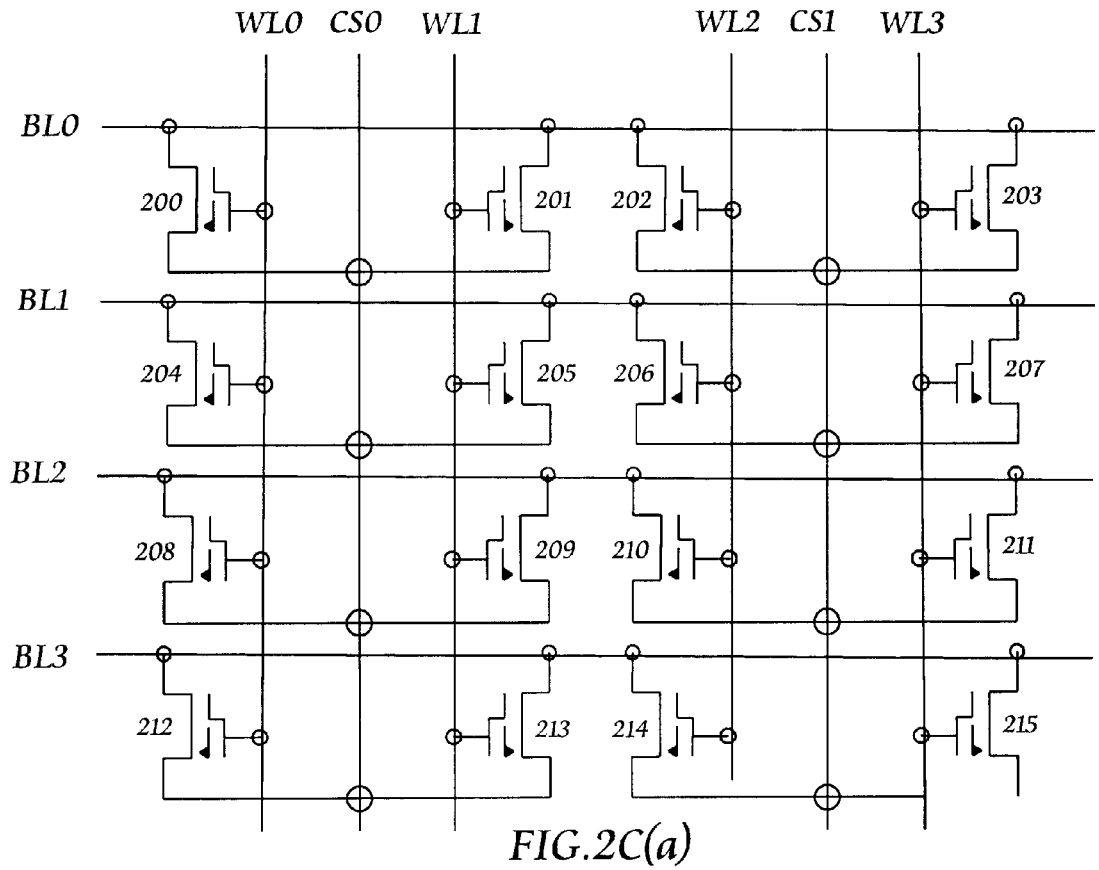
FIG. 2C(a) shows a schematic circuit diagram of a contactless NOR-type self-aligned split-gate flash memory array.
Figure 2C:
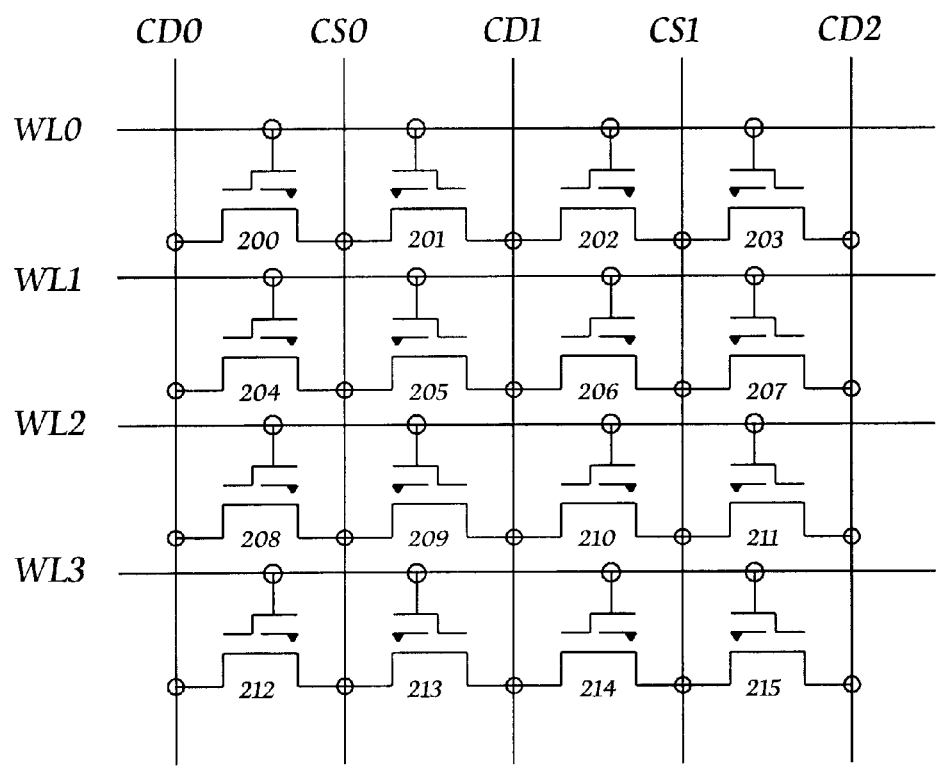

FIG. 2B(a) shows a top plan view of a contactless NOR-type flash memory array of the present invention, in which a cross-sectional view along the A–A' line is shown in FIG. 2A(a). As shown in FIG. 2B(a), a plurality of active regions (AA's) and a plurality of parallel STI regions (STI lines) are formed alternately on a semiconductor substrate 300 of a first conductivity type. A plurality of common-source conductive bus lines 317b and common-source auxiliary conductive bus lines 317c (CS0, CS1) are formed alternately and transversely to the plurality of parallel STI regions, wherein each of the plurality of common-source conductive bus lines 317b is formed over a first flat bed between a pair of first sidewall dielectric spacers 316a with the first flat bed being formed alternately by an etched first raised field-oxide layer 304c and a shallow heavily-doped source diffusion region 315b of a second conductivity type formed within a common-source diffusion region 315a and each of the plurality of auxiliary common-source conductive bus lines 317c is formed over each of the common-source conductive bus lines 317b between a pair of first auxiliary sidewall dielectric spacers 316c. A plurality of common-drain conductive islands 322b being formed alternately between the plurality of common-source conductive bus lines 317b and over the second flat beds between a pair of second sidewall dielectric spacers 321a, wherein each of the second flat beds is alternately formed by an etched second raised field-oxide layer 304e and a shallow heavily-doped drain diffusion region 320b of a second conductivity type formed within a common-drain diffusion region 320a. A plurality of self-aligned split-gate flash memory cells are located between each of the plurality of common-source conductive bus lines 317b and its nearby planarized common-drain conductive islands 322b, wherein each of a plurality of the word lines (WL0~WL2) is formed by an elongated planarized control/select-gate layer 312c, 313c having a portion formed on a first intergate-dielectric layer 307b and another portion formed on a surface being alternately formed by a second gate-dielectric layer 310b and a second raised field-oxide layer 304d; the first intergate-dielectric layer 307b is formed over a surface being alternately formed by an integrated floating-gate layer 305e and a portion of the first raised field-oxide layer 304b; the integrated floating-gate layer 305e having a second intergate-dielectric layer 311a formed over its inner sidewall includes a major floating-gate layer 302c being formed over a first gate-dielectric layer 301c and two extended floating-gate layers 305c being separately formed over the nearby first raised field-oxide layers 304b. A plurality of bit lines 325a (BL0~BL2) integrated with the plurality of planarized common-drain conductive islands 322b are simultaneously patterned and etched to be perpendicular to the plurality of common-source conductive bus lines 317b by using a plurality of hard masking layers, wherein each of the plurality of hard masking layers includes a third masking dielectric layer 326a being aligned above the active region (AA) and two fifth sidewall dielectric spacers 327a being formed over each sidewall of the third masking dielectric layer 326a. The various cross-sectional views as indicated by the B–B' line, the C–C' line, the D–D' line, and the E–E' line as shown in FIG. 2B(a) are shown in FIG. 5A through FIG. 5D, respectively. The schematic circuit diagram of FIG. 2B(a) is shown in FIG. 2C(a), in which the integrated floating-gate layer is marked with a dark triangle to indicate the erasing direction for each of the self-aligned split-gate flash memory cells of the present invention.

FIG. 2B(b) shows a contactless parallel common-source/drain conductive bit-lines flash memory array of the present invention, in which a plurality of active regions (AA's) and a plurality of parallel STI regions (STI lines) are alternately formed over a semiconductor substrate 300 of a first conductivity type. A plurality of common-source conductive bus lines 317b and auxiliary common-source conductive bus lines 317c (CS0, CS1) and a plurality of common-drain conductive bus lines 322b (CD0, CD1) are formed alternately and transversely to the plurality of parallel STI regions. A plurality of self-aligned split-gate flash memory cells are formed between each of the plurality of common-source conductive bus lines 317b and its nearby common-drain conductive bus lines 322b. A plurality of word lines (WL0~WL2) integrated with a plurality of planarized control/select-gate conductive islands 324b, 313d,312d are simultaneously patterned and etched to be perpendicular to the plurality of common-source/drain conductive bus lines 317b/322b by using a plurality of hard masking layers, wherein each of the plurality of hard masking layers comprises a third masking dielectric layer 326a being aligned above the active region and two fifth sidewall dielectric spacers 327a being formed over each sidewall of the third masking dielectric layer 326a. Similarly, each of the plurality of common-source conductive bus lines 317b is formed over a first flat bed between a pair of first sidewall dielectric spacers 316b with the first flat bed being alternately formed by an etched first raised field-oxide layer 304c and a shallow heavily-doped source diffusion region 315b of a second conductivity type formed within a common-source diffusion region 315a and each of the plurality of auxiliary common-source conductive bus lines 317c is formed over the common-source conductive bus line 317b between a pair of first auxiliary sidewall dielectric spacers 316d; each of the plurality of common-drain conductive bus lines 322b is formed over a second flat bed between a pair of second sidewall dielectric spacers 321b and the second flat bed is alternately formed by an etched second raised field-oxide layer 304e and a shallow heavily-doped drain diffusion region 320b of a second conductivity type formed within a common-drain diffusion region 320a. The various cross-sectional views as indicated by the B–B' lines, the C–C' lines, the D–D' lines, and the E–E' line shown in FIG. 2B(b) are shown in FIG. 6A through FIG. 6D, respectively. The schematic circuit diagram of FIG. 2B(b) is shown in FIG. 2C(b), in which the integrated floating-gate layer is marked with a dark triangle to indicate the erasing direction for each of the self-aligned split-gate flash memory cells of the present invention.

From FIG. 2B(a) and FIG. 2B(b), the width and the space of a shallow-trench-isolation (STI) region can be defined to be a minimum-feature-size (F) of technology used and the cell size as marked by a dash square in FIG. 2B(a) and FIG. 2B(b) is equal to $(X_1+X_2)F^2$, wherein $X_1$ and $X_2$ are the scaling factors. If the common-source region, the control/select-gate region, and the common-drain region are defined to be equal to a minimum-feature-size (F) of technology used, the cell size is equal to $4F^2$. It should be emphasized that the self-aligned split-gate flash memory cell is operated by mid-channel hot-electron injection for programming operation and the Fowler-Nordheim tunneling through two paths in the source side for high-speed erasing operation.

Accordingly, the major advantages and features of the present invention are summarized below:

(a) The self-aligned split-gate flash memory cell of the present invention is scalable and can be made to have a cell size smaller than $4F^2$.

(b) The self-aligned split-gate flash memory cell of the present invention can be erased with a larger source-side erasing area through the elevated conductive common-source bus line with respect to the integrated floating-gate layer for high-speed erasing operation.

(c) The self-aligned split-gate flash memory cell of the present invention is operated by mid-channel hot-electron injection with lower applied voltages, higher programming efficiency, and higher programming speed as compared to those of channel hot-electron injection.

(d) The contactless NOR-type flash memory array of the present invention offers a highly conductive bit line being integrated with common-drain conductive islands with lower bit-line resistance.

(e) The contactless parallel common-source/drain conductive bit-lines flash memory array of the present invention offers a highly conductive word line being integrated with planarized control/select-gate conductive islands with lower word-line resistance.

(f) The two contactless flash memory arrays of the present invention offer a highly common-source conductive bus line being alternately formed over the common-source diffusion regions with smaller bus-line resistance and smaller bus-line capacitance with respect to the semiconductor substrate as compared to those of the buried diffusion layer of the prior art.

Figure 3A:
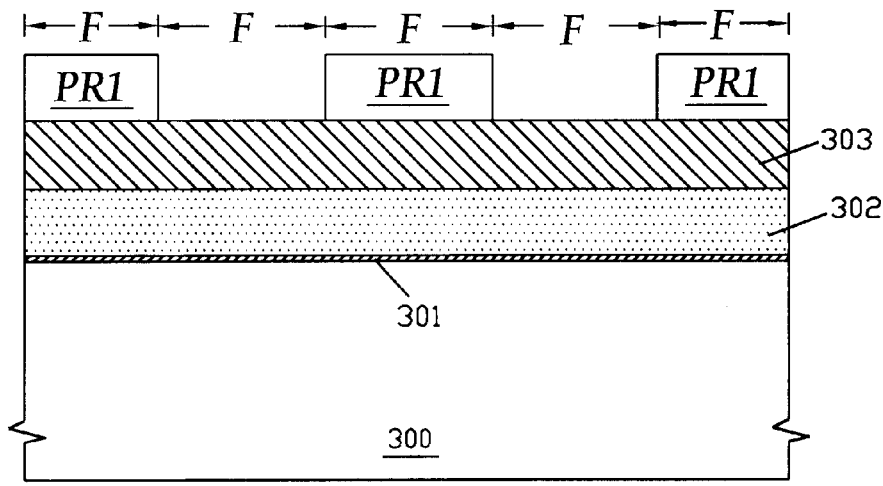
FIG. 3A through FIG. 3I show the process steps and their cross-sectional views of forming a shallow-trench-isolation structure for a self-aligned split-gate flash memory cell and its contactless flash memory arrays of the present invention.

Referring now to FIG. 3A through FIG. 3I, there are shown the process steps and their cross-sectional views of fabricating a shallow-trench-isolation (STI) structure for a self-aligned split-gate flash memory cell having a source-side erase structure and its contactless flash memory arrays. FIG. 3A shows that a first gate-dielectric layer 301 is formed on a semiconductor substrate 300 of a first conductivity type; a first conductive layer 302 is formed on the first gate-dielectric layer 301; a first masking dielectric layer 303 is formed on the first conductive layer 302; and a plurality of masking photoresist PR1 are formed over the first masking dielectric layer 303 to define a plurality of active regions (AA's) (under PR1) and a plurality of parallel shallow-trench-isolation regions (STI lines)(between PR1). The first gate-dielectric layer 301 is preferably a thermal-oxide layer or a nitrided thermal-oxide layer having a thickness between 80 Angstroms and 120 Angstroms. The first conductive layer 302 is preferably made of doped polycrystalline-silicon or doped amorphous-silicon as deposited by low-pressure chemical-vapor-deposition (LPCVD) and its thickness is preferably between 1000 Angstroms and 3000 Angstroms. The first masking dielectric layer 303 is preferably made of silicon-nitrides as deposited by LPCVD and its thickness is preferably between 1000 Angstroms and 5000 Angstroms. It should be noted that the width and the space of each of the plurality of masking photoresist PR1 can be defined to be a minimum-feature-size (F) of technology used, as indicated in FIG. 3A.

Figure 3B:
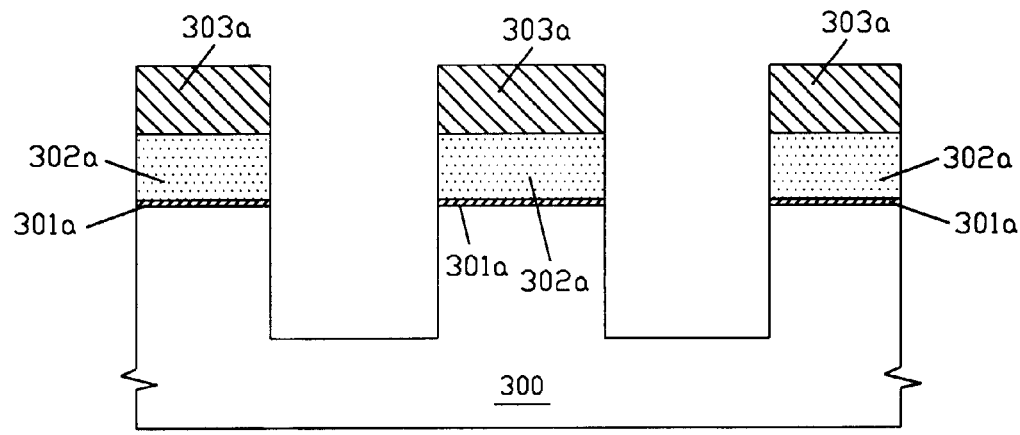

FIG. 3B shows that the first masking dielectric layer 303, the first conductive layer 302, and the first gate-dielectric layer 301 outside of the plurality of masking photoresist PR1 are sequentially removed and the semiconductor substrate 300 is then anisotropically etched to form shallow trenches; and subsequently, the plurality of masking photoresist PR1 are stripped. The depth of shallow trenches in the semiconductor substrate 300 is preferably between 3000 Angstroms and 8000 Angstroms.

Figure 3C:
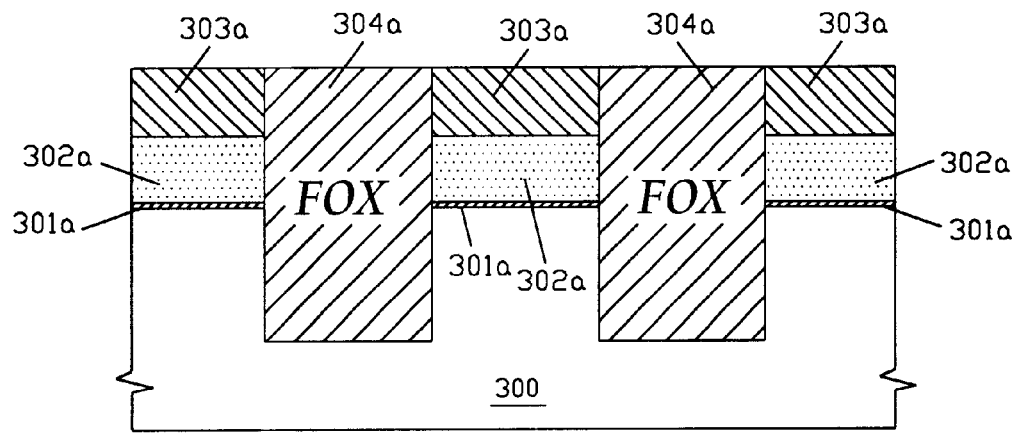

FIG. 3C shows that the planarized field-oxide layers 304a are formed to fill up the gaps as shown in FIG. 3B. The planarized field-oxide layer 304a is preferably made of silicon-oxides, phosphosilicate glass (PSG), or borophosphosilicate glass (BPSG), as deposited by high-density plasma (HDP) CVD or CVD and is formed by first depositing a thick silicon-oxide film 304 to fill up the gaps and then planarizing the deposited thick silicon-oxide film 304 using chemical-mechanical polishing (CMP) with the first masking dielectric layer 303a as a polishing stop.

Figure 3D:
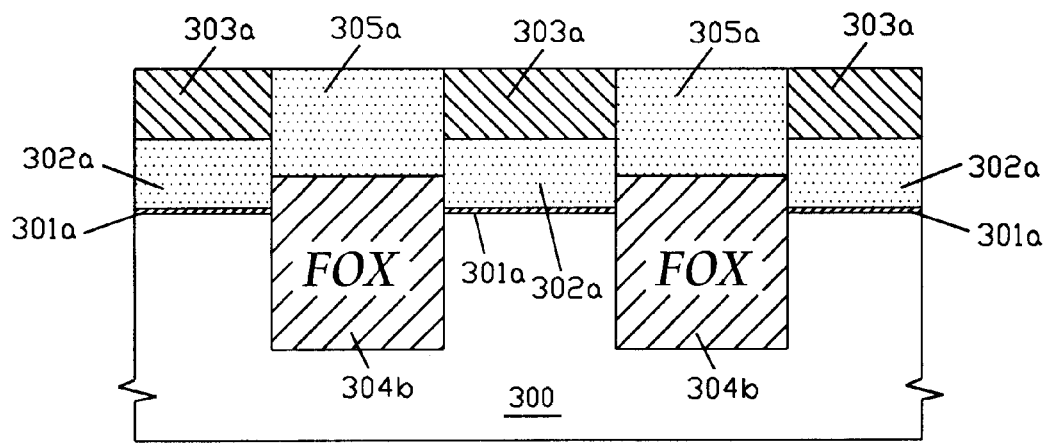

FIG. 3D shows that the planarized field-oxide layers 304a are etched back anisotropically to a level approximately equal to a half thickness of the first conductive layer 302a to form the first raised field-oxide layers 304b and a planarized second conductive layer 305a is then formed to fill up each gap formed by the etched-back planarized field-oxide layers 304a. The planarized second conductive layer 305a is preferably made of doped polycrystalline-silicon or doped amorphous-silicon as deposited by LPCVD and is formed by first depositing a thick second conductive layer 305 to fill up the gaps using LPCVD and then planarizing the deposited thick second conductive film 305 using CMP with the first masking dielectric layer 303a as a polishing stop.

Figure 3E:
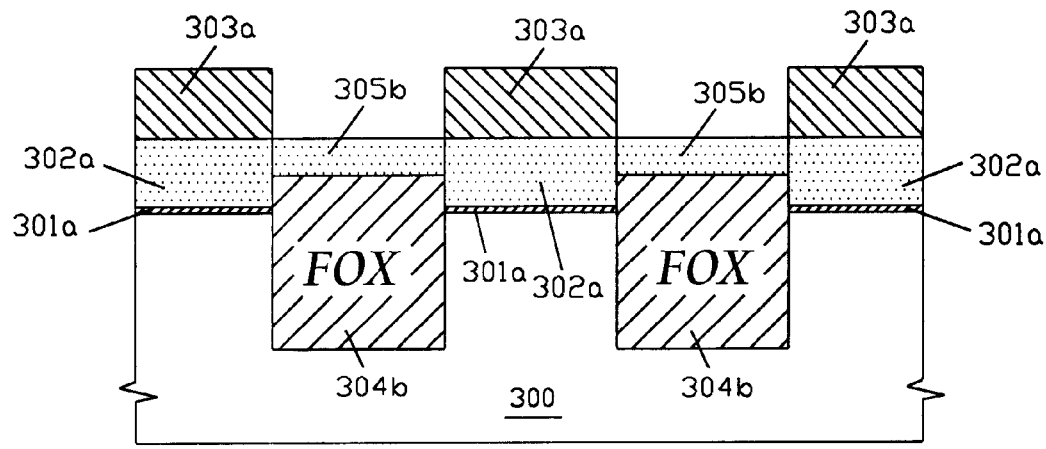

FIG. 3E shows that the planarized second conductive layers 305a are etched back anisotropically to a depth equal to the thickness of the first masking dielectric layer 303a to form the etched-back second conductive layers 305b.

Figure 3F:
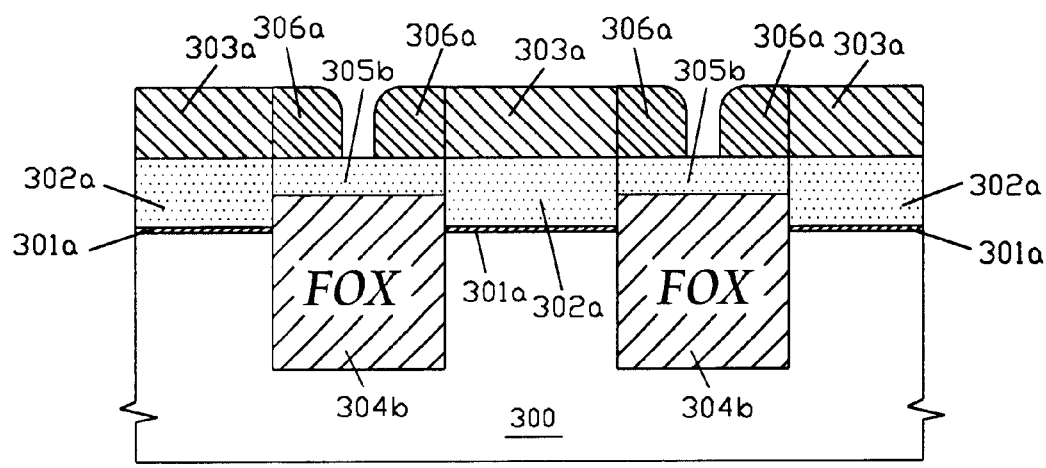

FIG. 3F shows a sixth sidewall dielectric spacer 306a is formed over each sidewall of the first masking dielectric layer 303a and on a portion of the etched-back second conductive layer 305b to define an extending length of the second conductive layer 302a in each side. The sixth sidewall dielectric spacer 306a is preferably made of silicon-nitrides as deposited by LPCVD. It should be noted that the spacer width of the sixth sidewall dielectric spacer 306a is determined by the thickness of the deposited dielectric layer.

Figure 3G:
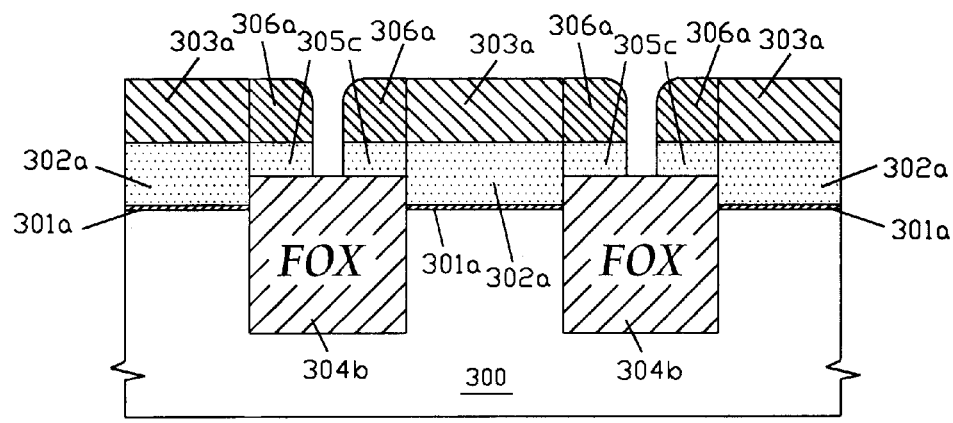

FIG. 3G shows that the etched-back second conductive layers 305b between the sixth sidewall dielectric spacers 306a are removed by anisotropic dry etching.

Figure 3H:
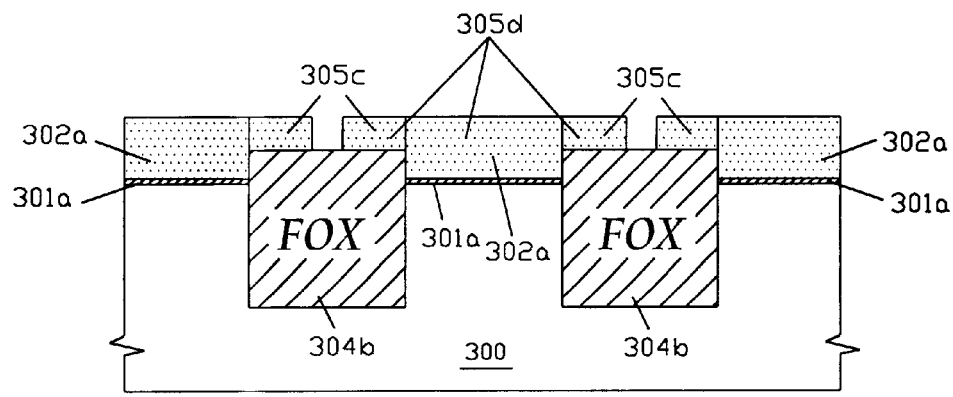

FIG. 3H shows that the first masking dielectric layers 303a and the sixth sidewall dielectric spacers 306a are removed by using hot-phosphoric acid or anisotropic dry etching. It is clearly visualized that the first conductive layer 302a and two extended second conductive layers 305c form an integrated floating-gate layer 305d to largely increase the coupling ratio of the floating-gate layer.

Figure 3I:
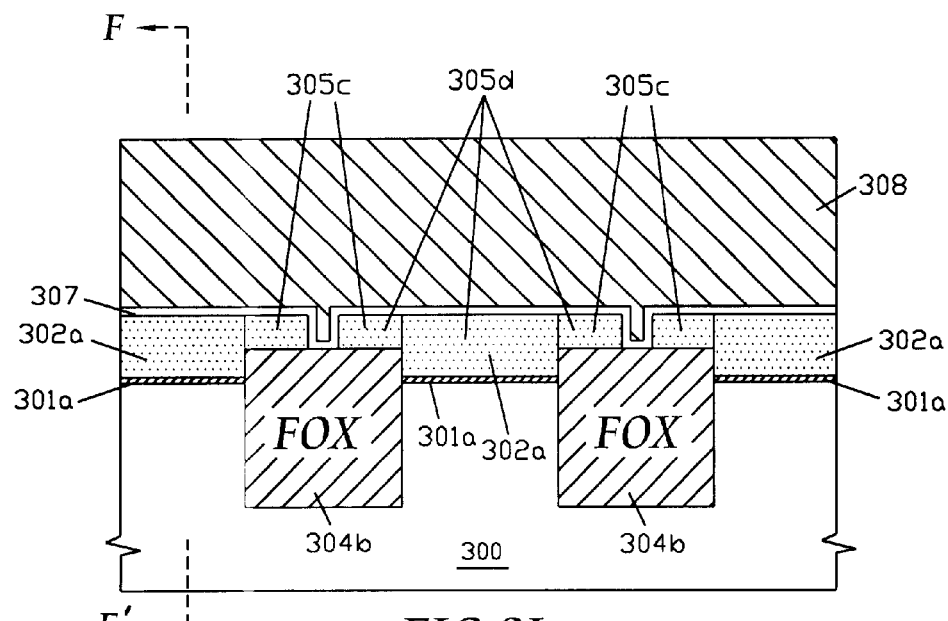

FIG. 3I shows that a first intergate-dielectric layer 307 is formed over the integrated floating-gate layers 305d and the exposed first raised field-oxide layers 304b and, subsequently, a second masking dielectric layer 308 is formed over the first intergate-dielectric layer 307. The first intergate-dielectric layer 307 is preferably an oxide-nitride-oxide (ONO) structure and its equivalent oxide thickness is preferably between 80 Angstroms and 120 Angstroms. The first intergate-dielectric layer 307 can be a silicon-oxide layer as deposited by high-temperature-oxide (HTO) deposition or using thermal oxidation and its thickness is preferably between 100 Angstroms and 200 Angstroms. The second masking dielectric layer 308 is preferably made of silicon-nitrides as deposited by LPCVD and its thickness is preferably between 4000 Angstroms and 12000 Angstroms. The cross-sectional view of an active region as marked by the F–F' line in FIG. 3I is shown in FIG. 4A.

Figure 4A:
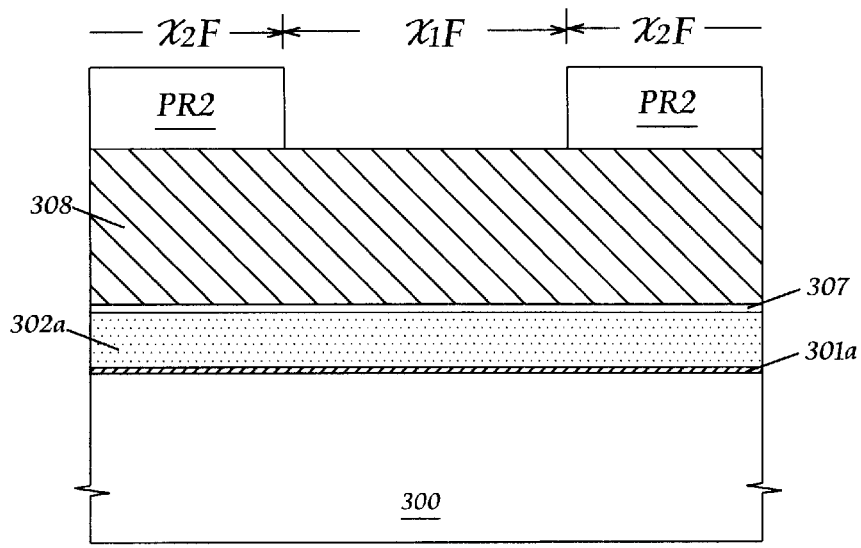
FIG. 4A through FIG. 4L(b) show the process steps and their cross-sectional views of forming a self-aligned split-gate flash memory cell and its contactless flash memory arrays of the present invention.

Referring now to FIG. 4A through FIG. 4L, there are shown the process steps and their cross-sectional views of fabricating a self-aligned split-gate flash memory cell having a source-side erase structure and its contactless flash memory arrays. FIG. 4A shows a small portion of a flash memory array, in which a plurality of masking photoresist PR2 are formed over the second masking dielectric layer 308 to define a plurality of first virtual-gate regions VG1 (between PR2) and a plurality of second virtual-gate regions VG2 (under PR2). Each of the plurality of first virtual-gate regions VG1 including a common-drain region and a pair of first control-gate regions is defined to be $X_1F$, wherein $X_1$ is a scaling factor. Each of the plurality of second virtual-gate regions VG2 including a common-source region and a pair of second control-gate regions is defined to be $X_2F$, wherein $X_2$ is also a scaling factor. It should be noted that both the first virtual-gate region VG1 and the second virtual-gate region VG2 are scalable. If $X_1$ and $X_2$ are equal to 2, the cell size will be equal to $4F^2$.

Figure 4B:
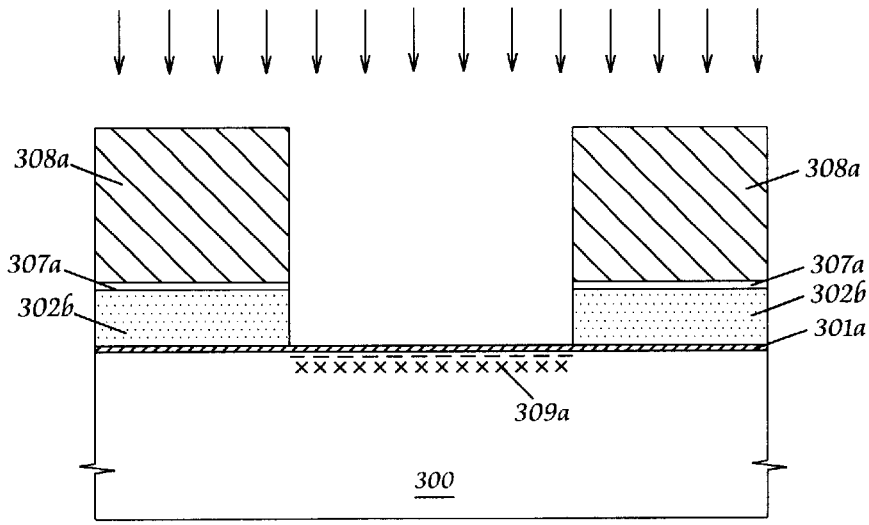

FIG. 4B shows that the second masking dielectric layer 308, the first intergate-dielectric layer 307, and the integrated floating-gate layer 305d including the first conductive layer 302a outside of the plurality of masking photoresist PR2 are sequentially removed by anisotropic dry etching and the plurality of masking photoresist PR2 are then stripped; and subsequently, an ion-implantation is performed to implant doping impurities across the first gate-dielectric layer 301a into the semiconductor substrate 300 in a self-aligned manner to form an implanted region 309a of a first conductivity type. The implanted region 309a may include a shallow implant region as indicated by a dash line for threshold-voltage adjustment and a deep implant region as indicated by the cross symbols for forming a punch-through stop.

Figure 4C:
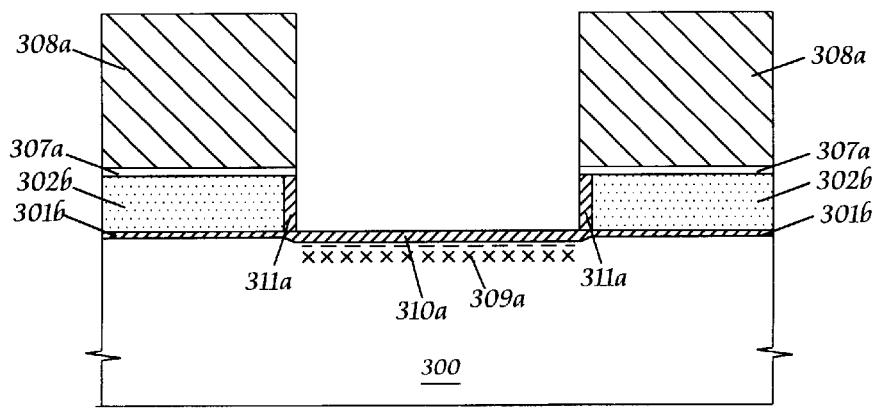

FIG. 4C shows that the first gate-dielectric layers 301a between the second masking dielectric layers 308a are removed by dipping in a dilute hydrofluoric acid or using anisotropic dry etching and the first raised field-oxide layers 304b are also slightly etched to form the second raised field-oxide layers 304d; a thermal oxidation process is then performed to form a second gate-dielectric layer 310a over each of the exposed semiconductor substrate 300 and a second intergate-dielectric layer 311a over each sidewall of the etched integrated floating-gate layers 305d including the first conductive layers 302b. The thickness of the second gate-dielectric layer 310a is preferably between 100 Angstroms and 300 Angstroms and the thickness of the second intergate-dielectric layers 311a will be slightly thicker due to the higher growth rate of doped polycrystalline-silicon or doped amorphous-silicon for the first and second conductive layers 302b, 305c.

Figure 4D:
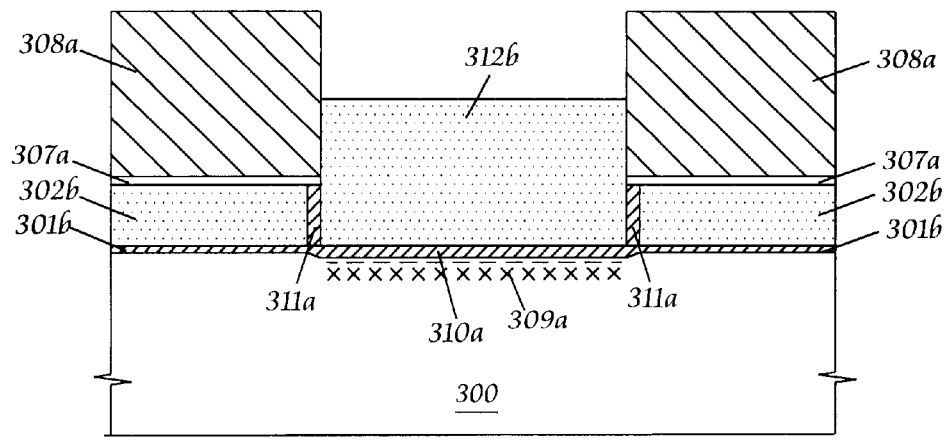

FIG. 4D shows that a planarized third conductive layer 312a is formed to fill up each gap in the first virtual-gate regions as shown in FIG. 4C and the planarized third conductive layers 312a are etched back by using anisotropic dry etching. The planarized third conducive layer 312a is preferably made of doped polycrystalline-silicon as deposited by LPCVD and is formed by first depositing a thick third conductive film 312 to fill up the gaps and then planarizing the deposited thick third conductive film 312 using CMP with the second masking dielectric layer 308a as a polishing stop. It should be noted that a tungsten-silicide (WSi$_2$) layer can be formed over the etched-back doped polycrystalline-silicon layer to form the etched-back third conductivity layer 312b by using a well-known self-aligned silicidation technique or a deposition/planarization/etch-back process. Besides, the etched-back third conductive layer 312b can be a composite conductive layer such as a tungsten/barrier-metal/doped polycrystalline-silicon structure.

Figure 4E:
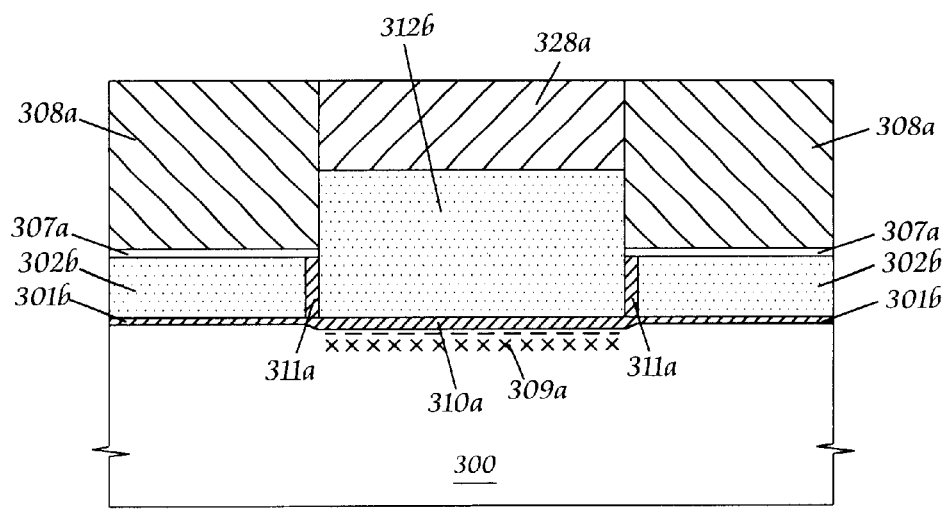

FIG. 4E shows that a planarized dielectric layer 328a is formed to fill up the gap formed by the etched-back third conductive layer 312b in each of the first virtual-gate regions VG1. The planarized dielectric layer 328a is preferably made of silicon-oxides as deposited by LPCVD and is formed by first depositing a thick silicon-oxide film 328 to fill up the gaps and then planarizing the deposited thick silicon-oxide film 328 using CMP with a second masking dielectric layer 308a as a polishing stop. It should be noted that the planarized dielectric layer 328a can be made of phosphosilicate glass or boro-phosphosiliacte glass as deposited by LPCVD or CVD.

Figure 4F:
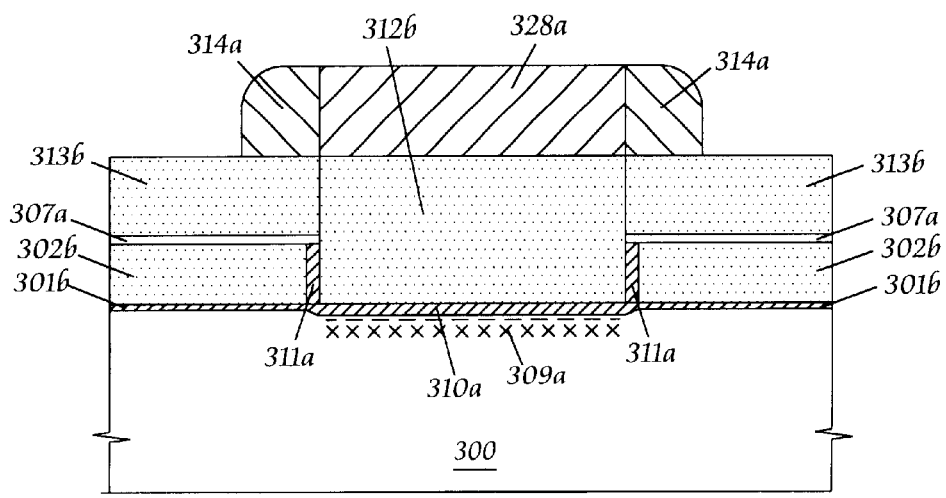

FIG. 4F shows that the second masking dielectric layers 308a in the second virtual-gate regions are removed by using hot-phosphoric acid; an etched-back fourth conductive layer 313b is then formed over the first intergate-dielectric layer 307a in each of the second virtual-gate regions VG2; and subsequently, a third sidewall dielectric spacer 314a is formed over each sidewall of the planarized dielectric layer 328a. The etched-back fourth conductive layer 313b is formed by using the same process as that of the etched-back third conductive layer 312b and is preferably made of doped polycrystalline-silicon deposited by LPCVD or is a doped polycrystalline-silicon layer capped with a tungsten-silicide layer. The third sidewall dielectric spacer 314a is preferably made of silicon-nitrides or oxynitrides as deposited by LPCVD.

Figure 4G:
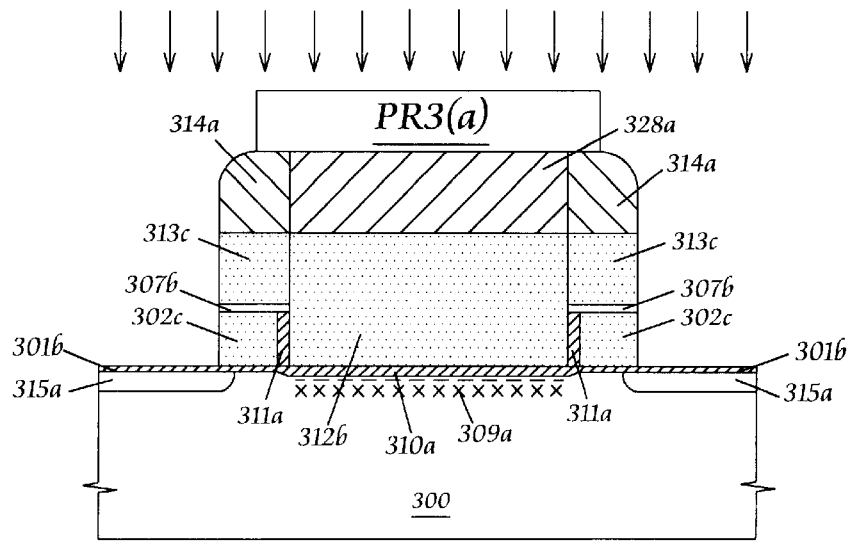

FIG. 4G shows that a plurality of making photoresist PR3(a) are formed over the planarized dielectric layers 328a and a portion of their nearby sidewall dielectric spacers 314a. The etched-back fourth conductive layers 313b and the first intergate-dielectric layers 307a outside of the third sidewall dielectric spacers 314a are sequentially removed first; then the extended floating-gate layers 305d are removed and the second conductive layer 302b are partially etched; and subsequently, the first raised field-oxide layers 304b are etched back to a top level of the first gate-dielectric layer 301b and the remained first conductive layers 302b are removed anisotropically. FIG. 4G also shows that an ion-implantation is performed to implant doping impurities across the first gate-dielectric layer 301b into the semiconductor substrate 300 of the active regions in each of the common-source regions to form the common-source diffusion regions 315a of a second conductivity type. The common-source diffusion region 315a can be lightly doped, moderately doped, or heavily doped.

Figure 4H:
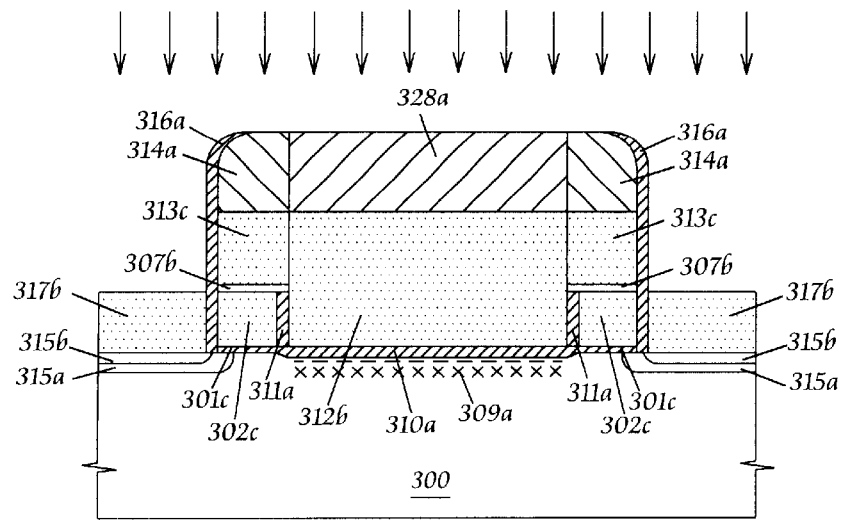

FIG. 4H shows that the first gate-dielectric layers 301b outside of the third sidewall dielectric spacers 314a are removed by dipping in a dilute hydrofluoric acid or using anisotropic dry etching and the etched raised field-oxide layers are simultaneously etched to form a first flat bed in each of the common-source regions, and the plurality of masking photoresist PR3(a) are stripped; a first sidewall dielectric spacer 316a is then formed over each sidewall of the second control-gate regions and on a portion of the first flat bed; and subsequently, an etched-back fifth conductive layer 317b is formed over each of the first flat bed between a pair of first sidewall dielectric spacers 316a. The first flat bed is alternately formed by an etched first raised field-oxide layer 304c and the common-source diffusion region 315a. The first sidewall dielectric spacer 316a is preferably made of silicon-oxides as deposited by HTO and its space width is preferably between 80 Angstroms and 200 Angstroms. The etched-back fifth conductive layer 317b is preferably made of doped polycrystalline-silicon as deposited by LPCVD and is formed by first depositing a thick fifth conductive film 317 to fill up the gaps between the pair of first sidewall dielectric spacers 316a and then planarizing the deposited thick fifth conductive film 317 using CMP with the third sidewall dielectric spacers 314a as a polishing stop and subsequently etching back the planarized fifth conductive layers 317a to a level approximately equal to or smaller than the top surface of the first conductive layer 302c. From FIG. 4H, an ion-implantation can be performed to heavily dope the etched-back fifth conductive layer 317b to be acted as a dopant diffusion source for forming a heavily-doped source diffusion region 315b of a second conductivity type within each of the common-source diffusion regions 315a.

Figure 4I:
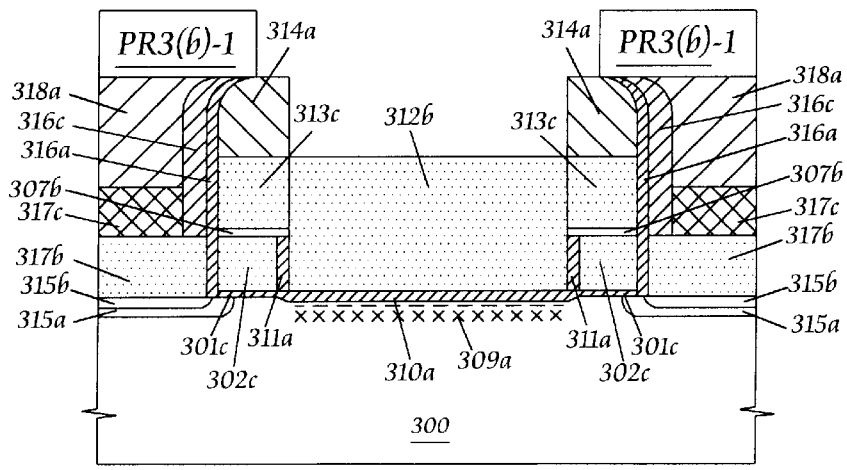

FIG. 4I shows that an auxiliary sidewall dielectric spacer 316c is formed over the first sidewall dielectric spacer 316a and on a portion of the etched-back fifth conductive layer 317b; an etched-back sixth conductive layer 317c is formed over the etched-back fifth conductive layer 317b between a pair of first auxiliary sidewall dielectric spacers 316c in each of the common-source regions; and a first planarized thick-oxide layer 318a is then formed over each of the etched-back sixth conductive layers 317c and each pair of first auxiliary sidewall dielectric spacers 316c. The first auxiliary sidewall dielectric spacer 316c is preferably made of silicon-oxides as deposited by LPCVD. The etched-back sixth conductive layer 317c is preferably a tungsten-silicide layer or a tungsten (W) layer and is preferably formed by etching back the planarized sixth conductive layer. The first planarized thick-oxide layer 318a is preferably made of silicon-oxides as deposited by LPCVD or is made of phosphosilicate glass (PSG) or boro-phosphosilicate glass (BPSG) deposited by HDPCVD or CVD. It should be emphasized that the etched-back sixth conductive layer 317c is mainly used to reduce the resistance of the etched-back fifth conductive layer 317b for forming a highly conductive common-source bus lines. It is also clear that the first auxiliary sidewall dielectric spacer 316c and the etched-back sixth conductive layer 317c can be deleted if the resistance of the etched-back fifth conductive layer 317b is tolerable. Similarly, the etched-back sixth conductive layer 317c can be substituted by directly siliciding the etched-back fifth conductive layer using a well-known self-aligned silicidation process and the metal-silicide layer formed is preferably a tungsten-silicide layer or other high melting-point metal-silicide layers. FIG. 4I also shows that a plurality of masking photoresist PR3(b)-1 are formed over the source regions and a portion of the third sidewall dielectric spacers 314a; the planarized dielectric layer 328a in each of the first virtual-gate regions are then removed by using buffered hydrofluoric acid or anisotropic dry etching; and subsequently, the plurality of masking photoresist PR3(b)-1 are stripped. It is clearly seen that the mask photoresist PR3(b)-1 can be a reverse tone of the mask photoresist for PR3(a).

Figure 4J:
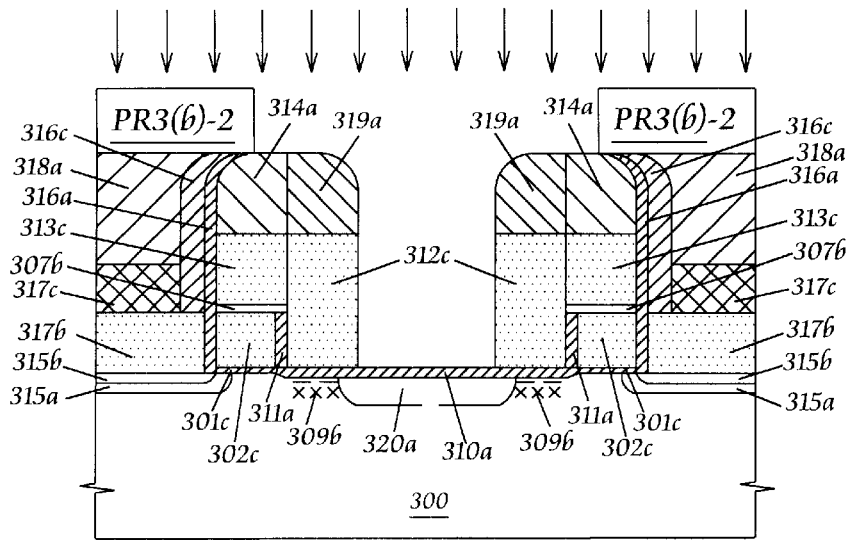
Figure 4K:
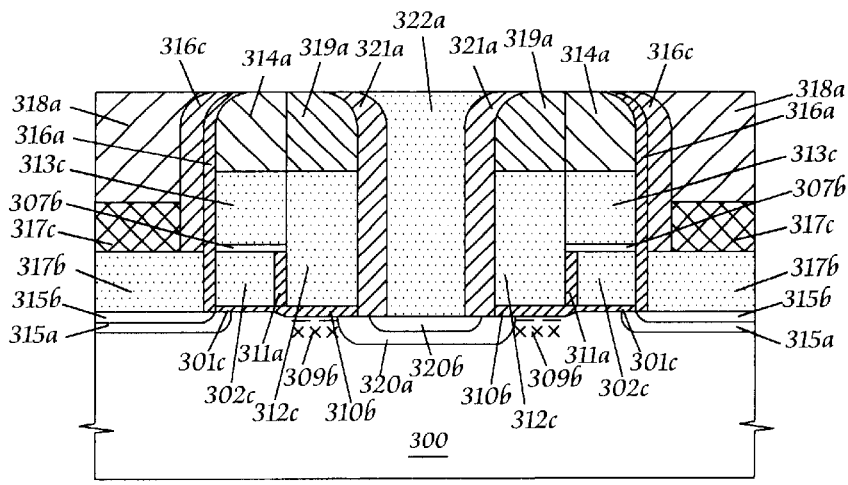
Figure 4K:
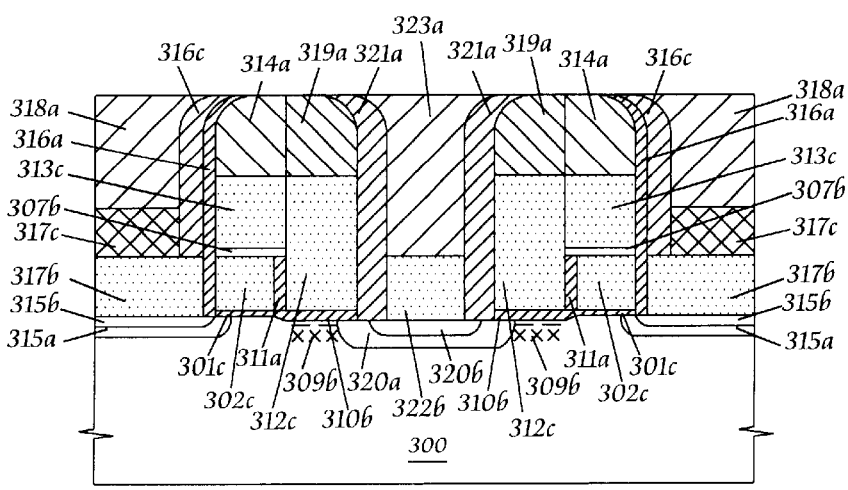

FIG. 4J shows that a fourth sidewall dielectric spacer 319a is formed over each sidewall of the third sidewall dielectric spacers 314a and on a portion of each etched-back third conductive layer 312b; a plurality of masking photoresist PR3(b)-2 are again formed over the same locations of PR3(b)-1; the etched-back third conductive layer 312b is partially etched to expose the second raised field-oxide layers 304d, the second raised field-oxide layers 304d are then etched back to a level equal to the top level of the second gate-dielectric layer 310a, and the remained etched-back third conductive layers 312b are removed by anisotropic dry etching; and subsequently, an ion-implantation is performed to implant doping impurities in a self-aligned manner across the second gate-dielectric layers 310a into the semiconductor substrate 300 of the active regions in each of the common-drain regions to form the common-drain diffusion regions 320a of a second conductivity type. The fourth sidewall dielectric spacer 319a is preferably made of silicon-nitrides as deposited by LPCVD. The common-drain diffusion 320a can be lightly doped, moderately doped, or heavily doped. It is clearly seen that the gate length of the planarized control/select gate layer 312c, 313c is defined by the third and fourth sidewall dielectric spacers 314a, 319a and is therefore scalable. FIG. 4K(a) shows that the second gate-dielectric layers 310a between each pair of fourth sidewall dielectric spacers 319a are removed by dipping in a dilute hydrofluoric acid or using anisotropic dry etching and the etched raised field-oxide layers 304d are simultaneously etched to form a second flat bed in each of the common-drain regions; the plurality of masking photoresist PR3(b)-2 are then stripped; a pair of second sidewall dielectric spacers 321a are formed over each sidewall of the select-gate regions and on a portion of the second flat bed; and subsequently, a planarized seventh conductive layer 322a is formed over the second flat bed between each pair of second sidewall dielectric spacers 321a. The second sidewall dielectric spacer 321a is preferably made of silicon-oxides as deposited by LPCVD. The second flat bed is alternately formed by an etched second raised field-oxide layer 304e and a common-drain diffusion region 320a. The planarized seventh conductive layer 322a is preferably made of doped polycrystalline-silicon as deposited by LPCVD and is preferably formed by first depositing a thin doped polycrystalline-silicon film being heavily implanted to be acted as a dopant diffusion source for forming a shallow heavily-doped drain diffusion region 320b of a second conductivity type within each of the common-drain diffusion regions 320a and then depositing and planarizing the thick doped polycrystalline-silicon film. The planarized seventh conductive layer 322a can be formed by first forming an etched-back doped polycrystalline layer being heavily implanted as before and then depositing and planarizing the thick tungsten or tungsten-silicide layer.

FIG. 4K(b) shows that the planarized seventh conductive layers 322a in FIG. 4K(a) are etched back and then heavily implanted to be acted as a dopant diffusion source for forming a shallow heavily-doped drain diffusion region 320b of a second conductivity type within each of the common-drain diffusion regions 320a; an etched-back tungsten-silicide or tungsten layer is then formed over the etched-back doped polycrystalline-silicon layer to form the common-drain conductive bus line 322b in each of the common-drain regions; and subsequently, a second planarized thick-oxide layer 323a is formed over each of the common-drain conductive bus lines 322b and each pair of second sidewall dielectric spacers 321a.

Figure 4L:
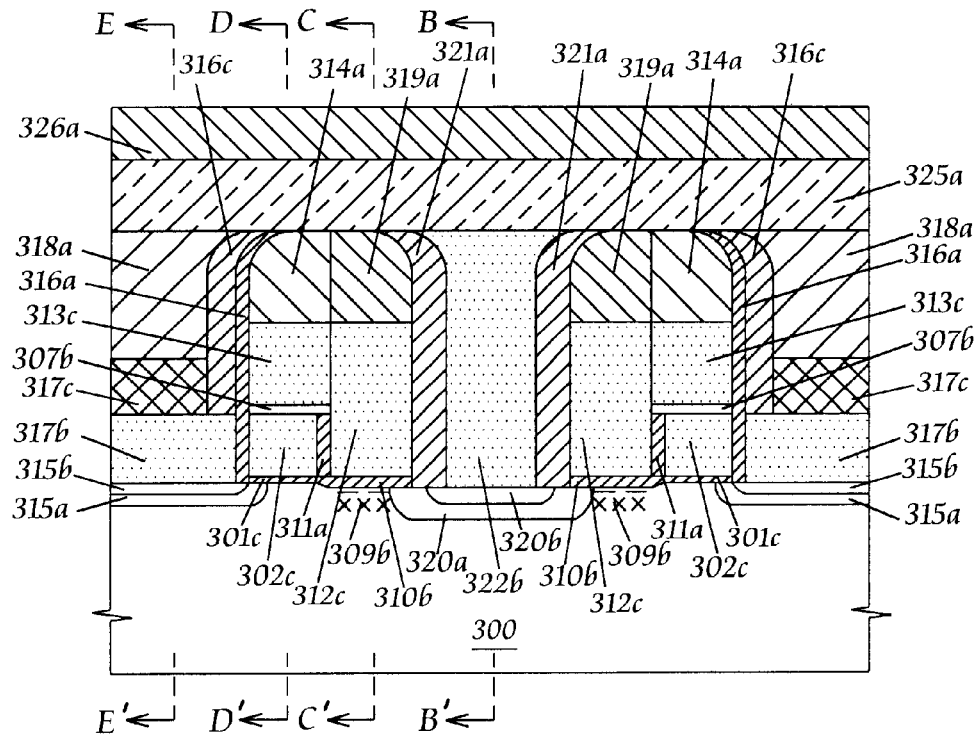
Figure 4L:
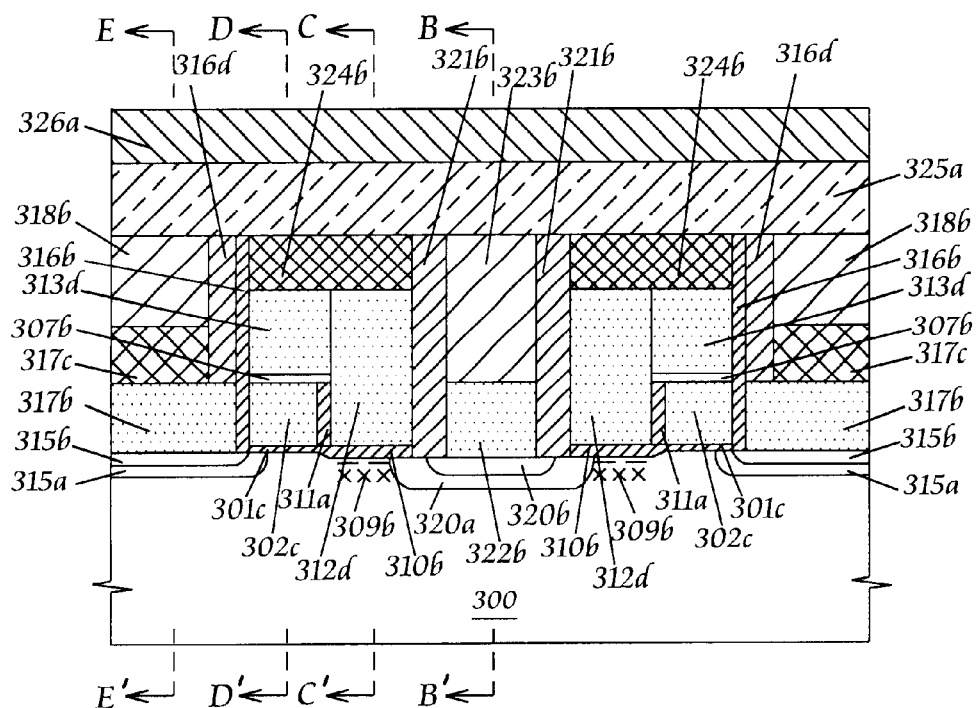

FIG. 4L(a) shows that a first interconnect-metal layer 325 is formed over the planarized surface shown in FIG. 4K(a) and a plurality of hard masking layers being formed over the first interconnect-metal layer 325 are used to simultaneously pattern and etch the first interconnect-metal layer 325 and the planarized seventh conductive layers 322a to form a plurality of bit lines 325a integrated with a plurality of common-drain conductive islands 322b. Each of the plurality of hard masking layers as shown in FIG. 5 includes a third masking dielectric layer 326a being aligned above the active region and two fifth sidewall dielectric spacers 327a being formed over each sidewall of the third masking dielectric layer 326a. The various cross sectional views shown in FIG. 4L(a) are shown in FIG. 5A through FIG. 5D, respectively. It is clearly seen that FIG. 4L(a) shows a cross-sectional view of a contactless NOR-type self-aligned split-gate flash memory array of the present invention.

FIG. 4L(b) shows that the first/second planarized thick-oxide layers 318a/323a, the first /second sidewall dielectric spacers 316a/321a, and the first auxiliary sidewall dielectric spacers 316c are first etched back to eliminate the curve portions and the third/fourth sidewall dielectric spacers 314a/319a are then selectively removed by hot-phosphoric acid or anisotropic dry etching; a planarized eighth conductive layer 324a is formed over the etched-back planarized third conductive layer 312c and the etched-back planarized fourth conductive layer 313c in each of the control/select-gate regions; a first interconnect-metal layer 325 is formed over the planarized structure; a plurality of hard masking layers being formed over the first interconnect-metal layer 325 are used to simultaneously pattern and etch the first interconnect-metal layer 325 and the planarized control/select-gate layers 324a, 313c, 312c to form a plurality of word lines 325a integrated with a plurality of planarized control/select-gate conductive islands 324b, 313d,312d. Each of the plurality of hard masking layers as shown in FIG. 6 includes a third masking dielectric layer 326a being aligned above the active region and two fifth sidewall dielectric spacers 327a being formed over each sidewall of the third masking dielectric layer 326a. The various cross-sectional views shown in FIG. 4L(b) are shown in FIG. 6A through FIG. 6D, respectively. It is clearly seen that FIG. 4L(b) shows a cross-sectional view of a contactless parallel common-source/drain conductive bit-lines self-aligned split-gate flash memory array of the present invention.

Referring now to FIG. 5A through FIG. 5D, there are shown various cross-sectional views as indicated in FIG.

Figure 5A:
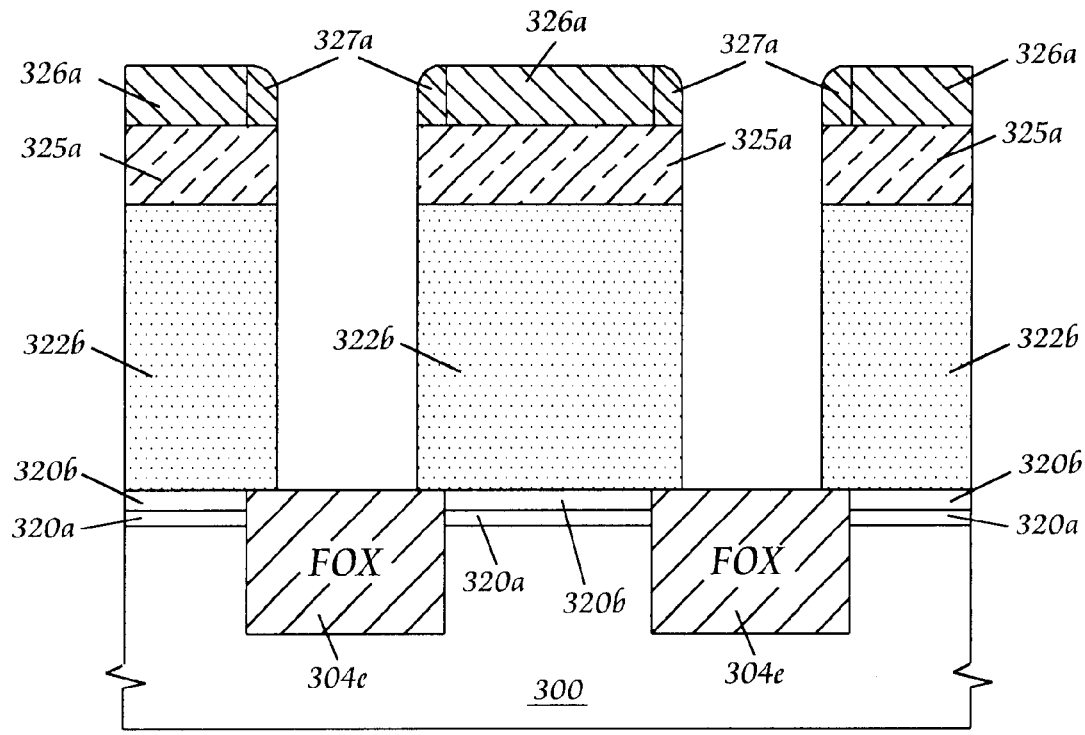
FIG. 5A though FIG. 5D show the various cross-sectional views of a contactless NOR-type self-aligned split-gate flash memory array of the present invention as indicated in FIG. 4L(a).

4L(a). FIG. 5A shows a cross-sectional view along each of the common-drain regions as indicated by the B–B' line shown in FIG. 4L(a), in which a plurality of bit lines 325a together with a plurality of planarized common-drain conductive islands 322b being patterned and etched by a plurality of hard masking layers are formed over a second flat bed being alternately formed by an etched second raised field-oxide layer 304e and a shallow heavily-doped drain diffusion region 320b of a second conductivity type formed within a common-drain diffusion region 320a; and each of the plurality of hard masking layers includes a third masking dielectric layer 326a being aligned above the active region and two fifth sidewall dielectric spacers 327a being formed over each sidewall of the third masking dielectric layer 326a to eliminate misalignment.

Figure 5B:
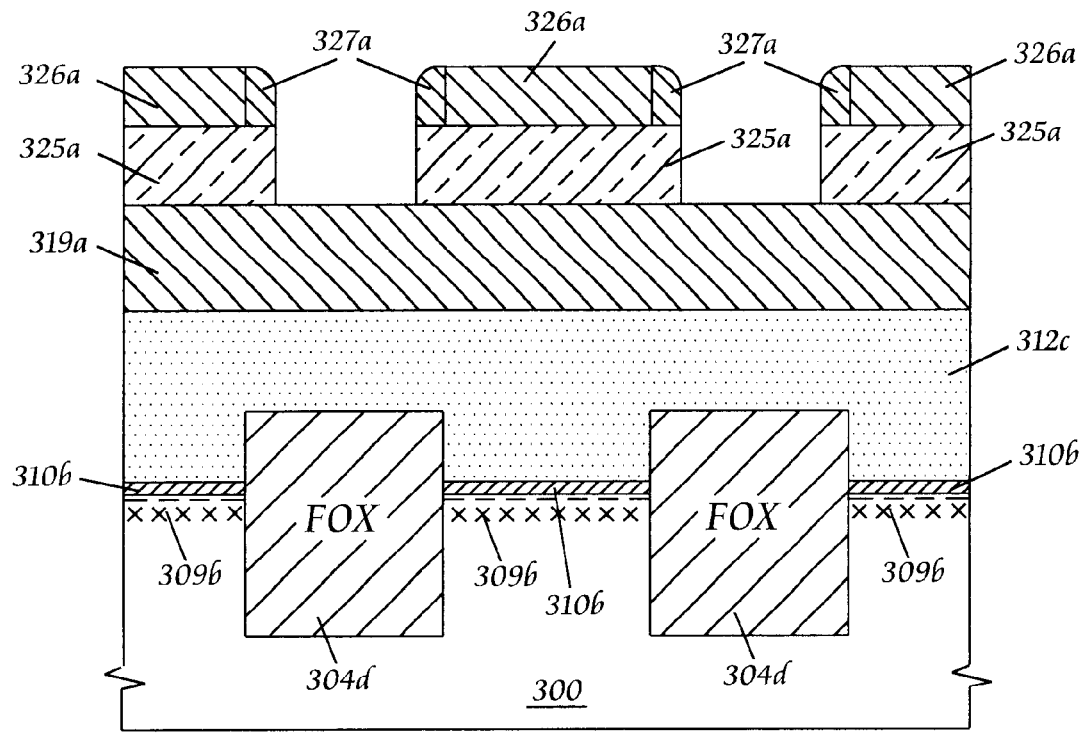

FIG. 5B shows a cross-sectional view along each of the select-gate regions as indicated by the C–C' line shown in FIG. 4L(a), in which the planarized control/select-gate layer 312c is alternately formed over a second gate-dielectric layer 310b and a second raised field-oxide layer 304d; the fourth sidewall dielectric spacer 319a is formed over the planarized control/select-gate conductive layer 312c; and a plurality of bit lines 325a being formed over the fourth sidewall dielectric spacer 319a are patterned and etched by a plurality of hard masking layers as described. An implanted region 309b of a first conductivity type being formed under the second gate-dielectric layer 310b includes a shallow implant region as indicated by the dash line for threshold-voltage adjustment and a deep implant region as indicated by the cross symbols for forming a punch-through stop.

Figure 5C:
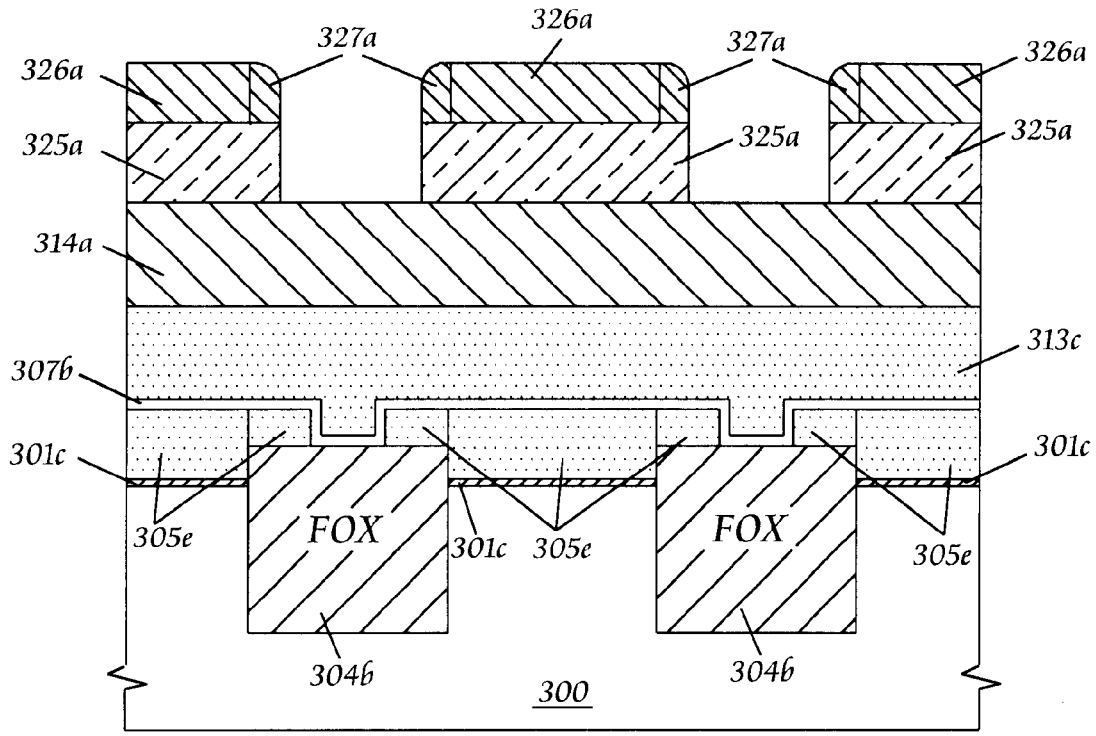

FIG. 5C shows a cross-sectional view along each of the floating-gate regions as indicated by the D–D' line shown in FIG. 4L(a), in which the first intergate-dielectric layer 307b is formed over the integrated floating-gate layers 305e and a portion of first raised field-oxide layers 304b; the planarized control/select-gate conductive layer 313c is formed over the first intergate-dielectric layer 307b; a third sidewall dielectric spacer 314a is formed over the planarized control/select-gate conductive layer 313c; a plurality of bit lines 325a are patterned and etched by the plurality of hard masking layers as described; a major portion of the integrated floating-gate layer 305e is formed over a first gate-dielectric layer 301c and its extended portions are formed over its nearby first raised field-oxide layers 304b.

Figure 5D:
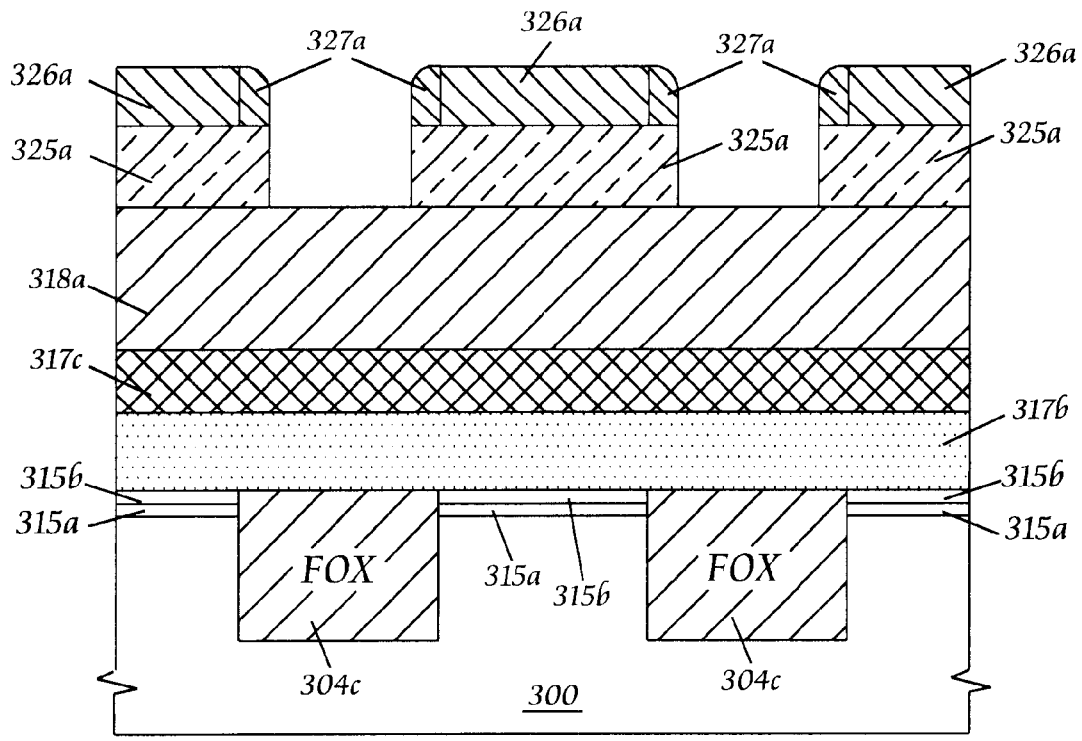

FIG. 5D shows a cross-sectional view along each of the common-source regions as indicated by the E–E' line shown in FIG. 4L(a), in which the common-source conductive bus line 317b capped with an auxiliary common-source conductive bus line 317c is formed over a first flat bed being alternately formed by an etched first raised field-oxide layer 304c and a shallow heavily-doped source diffusion region 315b of a second conductivity type formed within a common-source diffusion region 315a; a first planarized thick-oxide layer 318a is formed over the auxiliary common-source conductive bus line 317c; and a plurality of bit lines being patterned and etched by a plurality of hard masking layers as described are formed over the first planarized thick-oxide layer 318a.

Figure 6A:
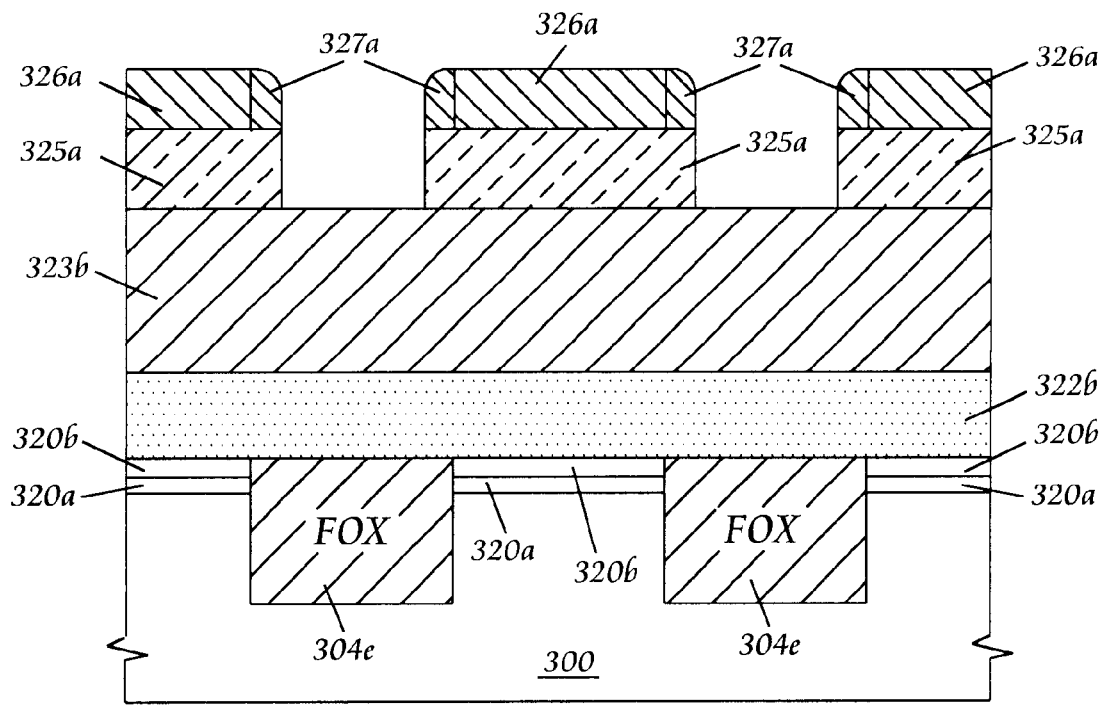
FIG. 6A through FIG. 6D show the various cross-sectional views of a contactless parallel common-source/drain conductive bit-lines self-aligned flash memory array of the present invention as indicated in FIG. 4L(b).

Referring now to FIG. 6A through FIG. 6D, there are shown various cross-sectional views shown in FIG. 4L(b). FIG. 6A shows a cross-sectional view along each of the common-drain regions as indicated by the B–B' line shown in FIG. 4L(b), in which a common-drain conductive bus line 322b is formed over a second flat bed being alternately formed by an etched second raised field-oxide layer 304e and a shallow heavily-doped drain diffusion region 320b of a second conductivity type formed within a common-drain diffusion region 320a; a second planarized thick-oxide layer 323b is formed over the common-drain conductive bus line 322b; and a plurality of word lines 325a being patterned and etched by a plurality of hard masking layers are formed over the second planarized thick-oxide layer 323b. Each of the plurality of hard masking layers includes a third masking dielectric layer 326a being aligned above the active region and two fifth sidewall dielectric spacers 327a being formed over each sidewall of the third masking dielectric layer 326a to eliminate misalignment.

Figure 6B:
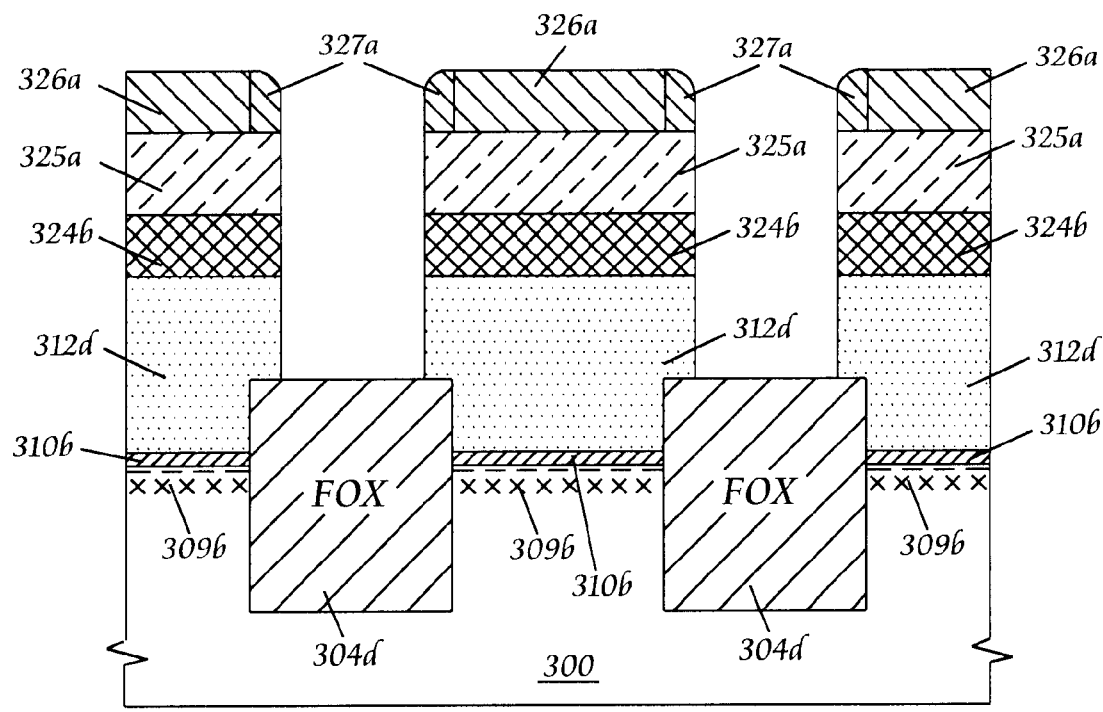

FIG. 6B shows a cross-sectional view along each of the select-gate regions as indicated by the C–C' line shown in FIG. 4L(b), in which a plurality of word lines 325a together with a plurality of planarized control/select-gate conductive islands 324b, 312d are patterned and etched by a plurality of hard masking layers as described; and each of the plurality of planarized control/select-gate conductive islands 324b, 312d is formed over a second gate-dielectric layer 310b and a portion of nearby second raised field-oxide layers 304d. An implanted region 309b of a first conductivity type being formed under a second gate-dielectric layer 310b includes a shallow implant region as indicated by the dash line for threshold-voltage adjustment and a deep implant region as indicated by the cross symbols for forming a punch-through stop.

Figure 6C:
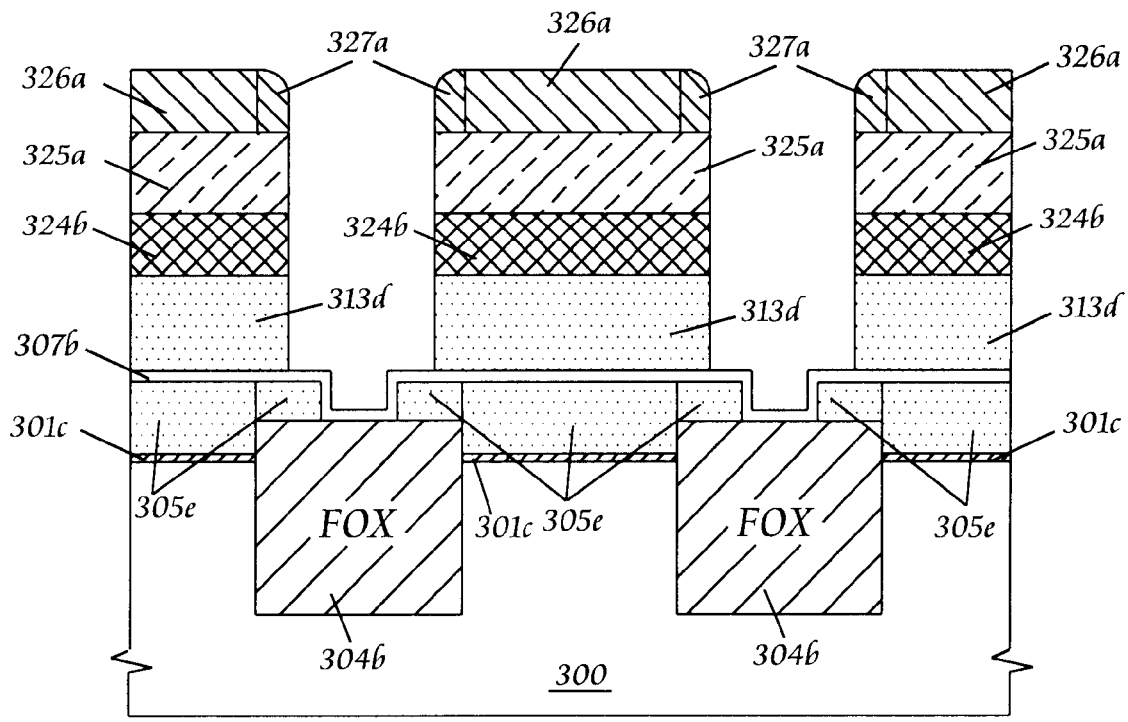

FIG. 6C shows a cross-sectional view along each of the floating-gate regions as indicated by the D–D' line shown in FIG. 4L(b), in which a plurality of word lines 325a together with a plurality of planarized control/select-gate conductive islands 324b, 313d being simultaneously patterned and etched by a plurality of hard masking layers as described are formed over a first intergate-dielectric layer 307b; the first intergate-dielectric layer 307b is alternately formed over an integrated floating-gate layers 305e and a portion of first raised field-oxide layers 304b; and a major portion of the integrated floating-gate layer 305e is formed over a first gate-dielectric layer 301c and its extended portions are formed over a portion of the nearby first raised field-oxide layers 304b.

Figure 6D:
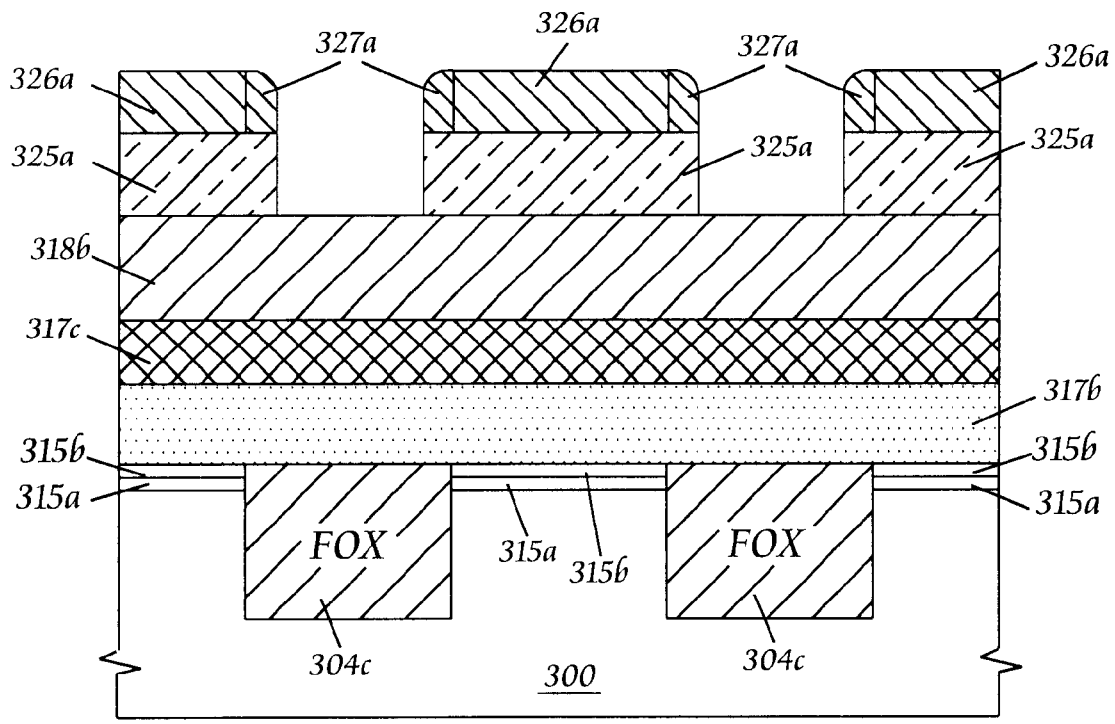

FIG. 6D shows a cross-sectional view along each of the common-source regions as indicated by the E–E' line shown in FIG. 4L(b), in which the common-source conductive bus line 317b capped with an auxiliary common-source conductive bus line 317c is formed over a first flat bed being alternately formed by an etched first raised field-oxide layer 304c and a shallow heavily-doped source diffusion region 315b of a second conductivity type being formed within a common-source diffusion region 315a; a first planarized thick-oxide layer 318b is formed over the auxiliary common-source conductive bus-line 317c; and a plurality of word lines being formed over the first planarized thick-oxide layer 318b are patterned and etched by a plurality of hard masking layers as described.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A self-aligned split-gate flash memory cell having an integrated source-side erase structure, comprising:

a semiconductor substrate of a first conductivity type having an active region isolated by two parallel shallow-trench-isolation (STI) regions;

a cell region being formed on said semiconductor substrate and divided into three regions: a common-source region, a gate region, and a common-drain region, wherein said gate region is located between said common-source region and said common-drain region;

said common-source region comprises a first sidewall dielectric spacer being formed over a sidewall of said gate region and on a portion of a first flat bed being formed by a common-source diffusion region of a second conductivity type in said active region and two etched first raised field-oxide layers in said two parallel STI regions; a common-source conductive layer being formed over said first flat bed outside of said first sidewall dielectric spacer; a first auxiliary sidewall dielectric spacer being formed over a sidewall of said first sidewall dielectric spacer and on a portion of said common-source conductive layer; an auxiliary common-source conductive layer being formed over said common-source conductive layer outside of said first auxiliary sidewall dielectric spacer; and a first planarized thick-oxide layer being formed over said auxiliary common-source conductive layer outside of said first auxiliary sidewall dielectric spacer;

said common-drain region comprises a second sidewall dielectric spacer being formed over another sidewall of said gate region and on a second flat bed being formed by a common-drain diffusion region of said second conductivity type in said active region and two etched second raised field-oxide layers in said two parallel STI regions; a planarized common-drain conductive island or a common-drain conductive layer being formed over said second flat bed outside of said second sidewall dielectric spacer with a second planarized thick-oxide layer being formed over said common-drain conductive layer outside of said second sidewall dielectric spacer; and said gate region comprises an integrated floating-gate layer having a major float-gate layer formed over a first gate-dielectric layer in said active region and two extended floating-gate layers formed separately over a portion of two first raised field-oxide layers in said two parallel STI regions; a first intergate-dielectric layer being formed over said integrated floating-gate layer and a portion of said two first raised field-oxide layers in a floating-gate region; a second intergate-dielectric layer being formed over an inner sidewall of said integrated floating-gate layer; and an elongated planarized control/select-gate conductive layer or a planarized control/select-gate conductive island being at least formed over a second-gate dielectric layer in a select-gate region and the first/second intergate-dielectric layers in said floating-gate region.

2. The self-aligned split-gate flash memory cell according to claim 1, wherein said first sidewall dielectric spacer is made of silicon-oxides as deposited by high-temperature-oxide (HTO) deposition and is acted as a tunneling-dielectric layer for erasing stored electrons in said integrated floating-gate layer to said common-source conductive layer.

3. The self-aligned split-gate flash memory cell according to claim 1, wherein said common-source/drain conductive layer comprises doped polycrystalline-silicon and is implanted with a high-dose of doping impurities to act as a dopant diffusion source for forming a shallow heavily-doped source/drain diffusion region of said second conductivity type within said common-source/drain diffusion region.

4. The self-aligned split-gate flash memory cell according to claim 1, wherein said auxiliary common-source conductive layer comprises a tungsten-silicide or tungsten layer.

5. The self-aligned split-gate flash memory cell according to claim 1, wherein said planarized common-drain conductive island comprises a heavily-doped polycrystalline-silicon island or a composite conductive structure having a tungsten or tungsten-silicide layer formed over a thin heavily-implanted doped polycrystalline-silicon layer.

6. The self-aligned split-gate flash memory cell according to claim 1, wherein an implanted region of said first conductivity type being formed under said second gate-dielectric layer comprises a shallow implant region for threshold-voltage adjustment and a deep implant region for forming a punch-through stop.

7. The self-aligned split-gate flash memory cell according to claim 1, wherein said elongated planarized control/select-gate conductive layer comprises a polycide-gate structure.

8. The self-aligned split-gate flash memory cell according to claim 7, wherein said polycide-gate structure comprises a tungsten silicide layer formed over a doped polycrystalline silicon layer.

9. The self-aligned split-gate flash memory cell according to claim 1, wherein said planarized control/select-gate conductive island comprises a heavily-doped polycrystalline-silicon island or a composite conductive island.

10. The self-aligned split-gate flash memory cell according to claim 9, wherein said composite conductive island comprises a tungsten or tungsten silicide layer formed over a heavily doped polycrystalline silicon layer.

11. A contactless NOR-type self-aligned split-gate flash memory array, comprising:

a semiconductor substrate of a first conductivity type having a plurality of active regions and a plurality of parallel STI regions formed alternately in a first direction;

a plurality of common-source regions and a plurality of common-drain regions being alternately formed on said semiconductor substrate in a second direction being perpendicular to said first direction, wherein a plurality of gate regions are formed alternately between the plurality of common-source regions and the plurality of common-drain regions;

each of the plurality of common-source regions comprises a pair of first sidewall dielectric spacers being formed over each sidewall of nearby gate regions and on a portion of a first flat bed being alternately formed by a common-source diffusion region of a second conductivity type in said active region and etched first raised field-oxide layers in said STI region; a common-source conductive bus line being formed over said first flat bed between the pair of first sidewall dielectric spacers; a pair of first auxiliary sidewall dielectric spacers being formed over each sidewall of the pair of first sidewall dielectric spacers and on a portion of said common-source conductive bus line; an auxiliary common-source conductive bus line being formed on said common-source conductive bus line between the pair of first auxiliary sidewall dielectric spacers; and a first planarized thick-oxide layer being formed over said auxiliary common-source conductive bus line between the pair of first auxiliary sidewall dielectric spacers;

each of the plurality of common-drain regions comprises a pair of second sidewall dielectric spacers being formed over each sidewall of nearby gate regions and on a portion of a second flat bed being alternately formed by a common-drain diffusion region of said second conductivity type in said active region and etched second raised field-oxide layers in said STI region; and a plurality of planarized common-drain conductive islands being formed between the pair of second sidewall dielectric spacers with each of the plurality of planarized common-drain conductive islands being formed on said common-drain diffusion region and a portion of nearby etched second raised field-oxide layers;

each of the plurality of gate regions comprises a plurality of integrated floating-gate layers being formed in a floating-gate region near each of the plurality of common-source regions, wherein each of the plurality of integrated floating-gate layers comprises a major floating-gate layer being formed on a first gate-dielectric layer in said active region and two extended floating-gate layers being separately formed on a portion of nearby first raised field-oxide layers; a first intergate-dielectric layer being formed in said floating-gate region and on a surface formed alternately by said integrated floating-gate layer and its space on said first raised field-oxide layers; a second intergate-dielectric layer being formed over each inner sidewall of the plurality of integrated floating-gate layers; and an elongated planarized control/select-gate conductive layer acting as a word line being formed over said first intergate-dielectric layer in said floating-gate region and on a surface in a select-gate region being alternately formed by a second gate-dielectric layer in said active region and a second raised field-oxide layer in said STI region; and a plurality of bit lines integrated with the plurality of planarized common-drain conductive islands being formed in said first direction and simultaneously patterned and etched by using a plurality of hard masking layers, wherein each of the plurality of hard masking layers comprises a masking dielectric layer being aligned to said active region and two sidewall dielectric spacers being formed over each sidewall of said masking dielectric layer.

12. The contactless NOR-type self-aligned split-gate flash memory array according to claim 11, wherein said first sidewall dielectric spacer being acted as a tunneling-dielectric layer is a silicon-oxide layer as deposited by high-temperature-oxide (HTO) deposition and is nitrided in a $N_2O$ or $NH_3$ ambient.

13. The contactless NOR-type self-aligned split-gate flash memory array according to claim 11, wherein said common-source conductive bus line is made of doped polycrystalline-silicon and is further heavily implanted to act as a dopant diffusion source for forming a shallow heavily-doped source diffusion region of said second conductivity type formed within said common-source diffusion region and said auxiliary common-source conductive bus line is made of tungsten-silicides or tungsten.

14. The contactless NOR-type self-aligned split-gate flash memory array according to claim 11, wherein an implanted region of said first conductivity type being formed under said second gate-dielectric layer comprises a shallow implant region for threshold-voltage adjustment and a deep implant region for forming a punch-through stop.

15. The contactless NOR-type self-aligned split-gate flash memory array according to claim 11, wherein said common-drain conductive island comprises a doped polycrystalline-silicon island or a composite conductive structure.

16. The contactless NOR-type self-aligned split gate flash memory array according to claim 15, wherein said common drain conductive island comprises a tungsten or tungsten silicide layer formed on a heavily implanted doped polycrystalline silicon layer.

17. The contactless NOR-type self-aligned split-gate flash memory array according to claim 11, wherein said elongated planarized control/select-gate conductive layer having two sidewall dielectric spacers formed over its top to define its gate length is a composite conductive structure.

18. The contactless NOR-type self-aligned split-gate flash memory array according to claim 17, wherein said composite conductive structure comprises a tungsten silicide layer formed over a doped polycrystalline silicon layer.

19. A contactless parallel common-source/drain conductive bit-lines self-aligned split-gate flash memory array, comprising:

a semiconductor substrate of a first conductivity type having a plurality of active regions and a plurality of parallel STI regions formed alternately in a first direction;

a plurality of common-source regions and a plurality of common-drain regions being alternately formed on said semiconductor substrate in a second direction being perpendicular to said first direction, wherein a plurality of gate regions are formed alternately between the plurality of common-source regions and the plurality of common-drain regions;

each of the plurality of common-source regions comprises a pair of first sidewall dielectric spacers being formed over each sidewall of nearby gate regions and on a portion of a first flat bed being alternately formed by a common-source diffusion of a second conductivity type in said active region and an etched first raised field-oxide layer in said STI region; a common-source conductive bus line being formed over said first flat bed between the pair of first sidewall dielectric spacers; a pair of first auxiliary sidewall dielectric spacers being formed over each sidewall of the pair of first sidewall dielectric spacers and on a portion of said common-source conductive bus line; an auxiliary common-source conductive bus line being formed over said common-source conductive bus line between the pair of first auxiliary sidewall dielectric spacers; and a first planarized thick-oxide layer being formed over said auxiliary common-source conductive bus line between the pair of first auxiliary sidewall dielectric spacers;

each of the plurality of common-drain regions comprises a pair of second sidewall dielectric spacers being formed over each sidewall of nearby gate regions and on a portion of a second flat bed being alternately formed by a common-drain diffusion region of said second conductivity type in said active region and an etched second raised field-oxide layer in said STI region; a common-drain conductive bus line being formed over said second flat bed between the pair of second sidewall dielectric spacers; and a second planarized thick-oxide layer being formed over said common-drain conductive bus line between the pair of second sidewall dielectric spacers;

each of the plurality of gate regions comprises a plurality of integrated floating-gate layers being formed in a floating-gate region near each of the plurality of common-source regions, wherein each of the plurality of integrated floating-gate layers comprises a major floating-gate layer being formed on a first gate-dielectric layer in said active region and two extended floating-gate layers being separately formed on a portion of nearby first raised field-oxide layers; a first intergate-dielectric layer being formed in said floating-gate region and on a surface formed alternately by said integrated floating-gate layer and its space on said first raised field-oxide layers; a second intergate-dielectric layer being formed over each inner sidewall of the plurality of integrated floating-gate layers; and a plurality of planarized control/select-gate conductive islands being alternately formed over said first intergate-dielectric layer in said floating-gate region and on a surface in a select-gate region being formed by a second gate-dielectric layer in said active region and a portion of nearby second raised field-oxide layers in said STI regions; and a plurality of word lines integrated with the plurality of planarized control/select-gate conductive islands being formed in said first direction and being simultaneously patterned and etched by using a plurality of hard masking layers, wherein each of the plurality of hard masking layers comprises a masking dielectric layer being aligned to said active region and two sidewall dielectric spacers being formed over each sidewall of said masking dielectric layer.

20. The contactless parallel common-source/drain conductive bit-lines self-aligned split-gate flash memory array according to claim 19, wherein said first sidewall dielectric spacer being acted as a tunneling-dielectric layer is a silicon-oxide layer as deposited by high-temperature-oxide (HTO) deposition and is preferably nitrided in a $N_2O$ or $NH_3$ ambient.

21. The contactless parallel common-source/drain conductive bit-lines self-aligned split-gate flash memory array according to claim 19, wherein said common-source conductive bus line comprises a doped polycrystalline-silicon layer and is further heavily implanted to act as a dopant diffusion source for forming a shallow heavily-doped source diffusion region of said second conductivity type formed within said common-source diffusion region and said auxiliary common-source conductive bus line comprises a tungsten or tungsten-silicide layer.

22. The contactless parallel common-source/drain conductive bit-lines self-aligned split-gate flash memory array according to claim 19, wherein an implanted region of said first conductivity type being formed under said second gate-dielectric layer comprises a shallow implant region for threshold-voltage adjustment and a deep implant region for forming a punch-through stop.

23. The contactless parallel common-source/drain conductive bit-lines self-aligned split-gate flash memory array according to claim 19, wherein said common-drain conductive bus line comprises a composite conductive structure.

24. The contactless parallel common-source/drain conductive bit-lines self aligned split gate flash memory array according to claim 23, wherein said composite conductive structure comprises a tungsten or tungsten-silicide layer formed on a heavily implanted doped polycrystalline silicon layer.

25. The contactless parallel common-source/drain conductive bit-lines self-aligned split-gate flash memory array according to claim 19, wherein said planarized control/select-gate conductive island comprises a composite conductive structure.

26. The contactless parallel common-source/drain conductive bit-lines self aligned split gate flash memory array according to claim 25, wherein said composite conductive structure comprises a metal silicide layer formed over a doped polycrystalline silicon layer or a tungsten/barrier metal/doped polycrystalline silicon structure.

* * * * *